US012804877B2

(12) United States Patent
Sharma et al.

(10) Patent No.: US 12,804,877 B2
(45) Date of Patent: Nov. 17, 2026

(54) HYBRID MANUFACTURING OF ACCESS TRANSISTORS FOR MEMORY

(71) Applicant: Intel Corporation, Santa Clara, CA (US)

(72) Inventors: Abhishek A. Sharma, Hillsboro, OR (US); Tahir Ghani, Portland, OR (US); Wilfred Gomes, Portland, OR (US); Anand S. Murthy, Portland, OR (US); Pushkar Sharad Ranade, San Jose, CA (US); Sagar Suthram, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 124 days.

(21) Appl. No.: 17/933,589

(22) Filed: Sep. 20, 2022

(65) Prior Publication Data

US 2024/0098965 A1 Mar. 21, 2024

(51) Int. Cl.
*H10B 12/00* (2023.01)
*G11C 5/06* (2006.01)
(Continued)

(52) U.S. Cl.
CPC .......... *H10B 12/053* (2023.02); *G11C 5/063* (2013.01); *G11C 5/10* (2013.01); *H10B 12/09* (2023.02); *H10B 12/31* (2023.02); *H10B 12/34* (2023.02); *H10B 12/482* (2023.02); *H10B 12/488* (2023.02); *H10B 12/50* (2023.02);
(Continued)

(58) Field of Classification Search
CPC ... H01L 23/481; H10B 12/053; H10B 12/482; H10B 53/40
See application file for complete search history.

(56) References Cited

U.S. PATENT DOCUMENTS 6,352,940 B1 * 3/2002 Seshan .............. H01L 21/76834 438/762
8,148,772 B2 4/2012 Doyle et al.
(Continued)

OTHER PUBLICATIONS

Chang et al., "A Thermodynamic Perspective of Negative-Capacitance Field-Effect Transistors" IEEE Journal on Exploratory Solid-State Computational Devices and Circuits; vol. 3; 9 pages (2017).
(Continued)

*Primary Examiner* — Steven M Page
(74) *Attorney, Agent, or Firm* — Akona IP PC

(57) ABSTRACT

Hybrid manufacturing of access transistors for memory, presented herein, explores how IC components fabricated by different manufacturers may be combined in an IC device to achieve advantages in terms of, e.g., performance, density, number of active memory layers, fabrication approaches, and so on. In one aspect, an IC device may include a support, a first circuit over a first portion of the support, a second circuit over a second portion of the support, a scribe line between the first circuit and the second circuit, and one or more electrical traces extending over the scribe line. In another aspect, an IC device may include a support, a memory array, comprising a first circuit over a first portion of the support and one or more layers of capacitors over the first circuit, and a second circuit over a second portion of the support.

22 Claims, 15 Drawing Sheets

(51) Int. Cl.

| | |
|---|---|
| ***G11C 5/10*** | (2006.01) |
| ***H10B 53/20*** | (2023.01) |
| ***H10B 53/30*** | (2023.01) |
| ***H10B 53/40*** | (2023.01) |
| ***H10W 20/20*** | (2026.01) |
| ***H10W 90/00*** | (2026.01) |

(52) U.S. Cl.

CPC ............. *H10B 53/20* (2023.02); *H10B 53/30* (2023.02); *H10B 53/40* (2023.02); *H10W 20/20* (2026.01); *H10W 90/00* (2026.01); *H10B 12/056* (2023.02); *H10B 12/36* (2023.02)

(56) References Cited

U.S. PATENT DOCUMENTS

| | | | |
|---|---|---|---|
| 11,018,264 | B1 | 5/2021 | Gomes et al. |
| 2006/0239605 | A1 | 10/2006 | Palen et al. |
| 2016/0336327 | A1* | 11/2016 | Park ..................... H10B 12/053 |
| 2017/0103988 | A1 | 4/2017 | Nishida et al. |
| 2017/0139132 | A1 | 5/2017 | Patel et al. |
| 2017/0269481 | A1* | 9/2017 | Borodovsky ......... H01J 37/045 |
| 2018/0269196 | A1 | 9/2018 | Isogai et al. |
| 2019/0067206 | A1 | 2/2019 | Bedeschi et al. |
| 2019/0189357 | A1 | 6/2019 | Chavan et al. |
| 2019/0221557 | A1 | 7/2019 | Kim et al. |
| 2019/0371802 | A1 | 12/2019 | Morris et al. |
| 2020/0083229 | A1* | 3/2020 | Kim ....................... G11C 5/063 |
| 2020/0135719 | A1 | 4/2020 | Brewer |
| 2020/0176949 | A1 | 6/2020 | Gotoda |
| 2020/0194443 | A1 | 6/2020 | Lin et al. |
| 2020/0273867 | A1 | 8/2020 | Manipatruni et al. |
| 2020/0286984 | A1 | 9/2020 | Chang et al. |
| 2020/0357453 | A1 | 11/2020 | Slesazeck et al. |
| 2020/0379173 | A1 | 12/2020 | Coolbaugh et al. |
| 2020/0411428 | A1 | 12/2020 | Lilak et al. |
| 2021/0125990 | A1 | 4/2021 | Gomes et al. |
| 2021/0134802 | A1 | 5/2021 | Gomes et al. |
| 2021/0151438 | A1 | 5/2021 | Gomes et al. |
| 2021/0159229 | A1 | 5/2021 | Gomes et al. |
| 2021/0193666 | A1 | 6/2021 | Gomes et al. |
| 2021/0398991 | A1 | 12/2021 | Manfrini et al. |
| 2022/0181256 | A1 | 6/2022 | Gomes et al. |
| 2022/0181313 | A1 | 6/2022 | Gomes et al. |
| 2022/0187536 | A1 | 6/2022 | Sharma et al. |
| 2022/0199635 | A1 | 6/2022 | Shivaraman et al. |
| 2022/0293546 | A1* | 9/2022 | Yang ....................... H01L 24/19 |
| 2022/0344359 | A1 | 10/2022 | Ali et al. |
| 2023/0282595 | A1* | 9/2023 | West ..................... H01L 23/585 |
| 2024/0107749 | A1 | 3/2024 | Sharma et al. |

OTHER PUBLICATIONS

Chang et al., “Inversion Charge Boost and Transient Steep-Slope Induced by Free-Charge-Polarization Mismatch in a Ferroelectric-Metal-Oxide-Semiconductor Capacitor,” IEEE Journal on Exploratory Solid-State Computational Devices and Circuits; vol. 4, No. 2; 6 pages (Dec. 2018).

Chang et al., “Physical Origin of Transient Negative Capacitance in a Ferroelectric Capacitor,” Physical Review Applied 9; 8 pages (2018).

Tallis, Billy, “Micron 3D NAND Status Update,” AnandTech, retrieved from the internet on Jun. 10, 2019, https://www.anandtech.com/show/10028/micron-3d-nand-status-update, 6 pages.

* cited by examiner

HYBRID MANUFACTURING OF ACCESS TRANSISTORS FOR MEMORY

BACKGROUND

Embedded memory is important to the performance of modern system-on-a-chip (SoC) technology. Low-power and high-density embedded memory is used in many different computer products and further improvements are always desirable.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Figure 1:
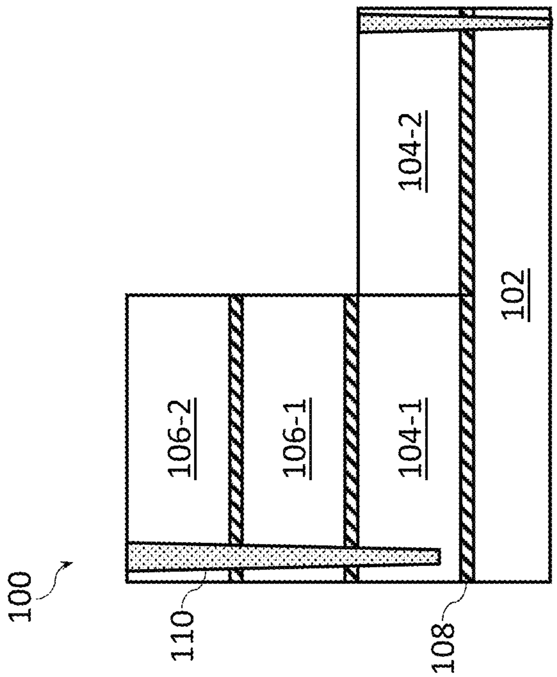
FIG. 1 provides a block diagram of an integrated circuit (IC) device fabricated using hybrid manufacturing of access transistors for memory, according to some embodiments of the present disclosure.

The systems, methods and devices of this disclosure each have several innovative aspects, no single one of which is solely responsible for all of the desirable attributes disclosed herein. Details of one or more implementations of the subject matter described in this specification are set forth in the description below and the accompanying drawings.

For purposes of illustrating IC devices fabricated using hybrid manufacturing of access transistors for memory as described herein, it might be useful to first understand phenomena that may come into play in certain IC arrangements. The following foundational information may be viewed as a basis from which the present disclosure may be properly explained. Such information is offered for purposes of explanation only and, accordingly, should not be construed in any way to limit the broad scope of the present disclosure and its potential applications.

Some memory devices may be considered "standalone" devices in that they are included in a chip that does not also include compute logic (where, as used herein, the term "compute logic devices" or simply "compute logic" or "logic devices," refers to IC components, e.g., transistors, for performing computing/processing operations). Other memory devices may be included in a chip along with compute logic and may be referred to as "embedded" memory devices. Using embedded memory to support compute logic may improve performance by bringing the memory and the compute logic closer together and eliminating interfaces that increase latency. Various embodiments of the present disclosure relate to embedded memory arrays, as well as corresponding methods and devices.

Access transistors have been used in the past to realize memory where each memory cell includes one capacitor for storing a memory state (e.g., logical "1" or "0") of the cell and an access transistor controlling access to the cell (e.g., access to write information to the cell or access to read information from the cell). Such a memory cell may be referred to as a "1T-1C memory cell," highlighting the fact that it uses one access transistor (i.e., "1T" in the term "1T-1C memory cell") and one capacitor (i.e., "1C" in the term "1T-1C memory cell"). The capacitor of a 1T-1C memory cell may be coupled to either a source or a drain (S/D) terminal/region of the access transistor (e.g., to the source terminal/region of the access transistor), while the other S/D terminal/region of the access transistor (e.g., to the drain terminal/region) may be coupled to a bitline, and a gate terminal of the access transistor may be coupled to a wordline. Since such a memory cell can be fabricated with as little as a single access transistor, it can provide higher density and lower standby power versus some other types of memory in the same process technology.

Typically, a given IC die includes memory of one type, e.g., a die may include 1T-1C memory. Inventors of the present disclosure realized that combining transistors of different transistor architectures and/or combining memory arrays of different memory architectures would allow flexible combination of IC components with various characteristics, such as high-density vs high-performance, and so on. Various embodiments of hybrid manufacturing of access transistors for memory, presented herein, explore how IC components fabricated by different manufacturers may be combined in an IC device to achieve advantages in terms of, e.g., performance, density, number of active memory layers, fabrication approaches, and so on.

In one aspect of the present disclosure, an example IC device may include a support structure, which may also be referred to simply as "support" (e.g., a wafer, a substrate, a chip, or a die); a first circuit over a first portion of the support; a second circuit over a second portion of the support; a scribe line between the first circuit and the second circuit; and one or more electrical traces extending over the scribe line. One or both of the first and second circuits may include transistors that may serve as access transistors of a memory array, and the IC device may further include one or more layers of storage elements (e.g., capacitors) of the memory array, thus realizing embedded memory. The access transistors may be provided by one manufacturer and the storage elements may be provided by a different manufacturer and, hence, such an IC device is one example of an IC device fabricated using hybrid manufacturing of access transistors for memory.

In another aspect, an example IC device may include a support; a memory array, comprising a first circuit over a first portion of the support and one or more layers of capacitors over the first circuit; and a second circuit over a second portion of the support. In such an IC device, the first circuit includes transistors of a first transistor architecture, the second circuit includes transistors of a second transistor architecture, and individual memory units of the memory array include one of the transistors of the first circuit coupled to one or more capacitors of the one or more layers of capacitors. The transistors of the first and second circuits may be provided by different manufacturers and at least the transistors of the first circuit may serve as access transistors in the memory array. Therefore, such an IC device is another example of an IC device fabricated using hybrid manufacturing of access transistors for memory.

In yet another aspect, an example IC device may include a support; a first memory array over a first portion of the support; and a second memory array over a second portion of the support, where the first memory array includes memory units of a first memory architecture, and the second memory array includes memory units of a second memory architecture. The memory units of the first and second memory arrays may be provided by different manufacturers and both memory arrays may include access transistors. Therefore, such an IC device is yet another example of an IC device fabricated using hybrid manufacturing of access transistors for memory.

Some aspects of IC devices fabricated using hybrid manufacturing of access transistors for memory are described herein with reference to hysteretic memory arrangements and corresponding methods and devices. Hysteretic memory refers to a memory technology employing hysteretic materials or arrangements, where a material or an arrangement may be described as hysteretic if it exhibits the dependence of its state on the history of the material (e.g., on a previous state of the material). Ferroelectric (FE) and antiferroelectric (AFE) materials are one example of hysteretic materials. Layers of different materials arranged in a stack to exhibit charge-trapping phenomena is one example of a hysteretic arrangement.

A FE or an AFE material is a material that exhibits, over some range of temperatures, spontaneous electric polarization, i.e., displacement of positive and negative charges from their original position, where the polarization can be reversed or reoriented by application of an electric field. In particular, an AFE material is a material that can assume a state in which electric dipoles from the ions and electrons in the material may form a substantially ordered (e.g., substantially crystalline) array, with adjacent dipoles being oriented in opposite (antiparallel) directions (i.e., the dipoles of each orientation may form interpenetrating sub-lattices, loosely analogous to a checkerboard pattern), while a FE material is a material that can assume a state in which all of the dipoles point in the same direction. Because the displacement of the charges in FE and AFE materials can be maintained for some time even in the absence of an electric field, such materials may be used to implement memory cells. Because the current state of the electric dipoles in FE and AFE materials depends on the previous state, such materials are hysteretic materials. Memory technology where logic states are stored in terms of the orientation of electric dipoles in (i.e., in terms of polarization of) FE or AFE materials is referred to as "FE memory," where the term "ferroelectric" is said to be adopted to convey the similarity of FE memories to ferromagnetic memories, despite the fact that there is typically no iron (Fe) present in FE or AFE materials.

A stack of alternating layers of materials that is configured to exhibit charge-trapping is an example of a hysteretic arrangement. Such a stack may include as little as two layers of materials, one of which is a charge-trapping layer (i.e., a layer of a material configured to trap charges when a volage is applied across the material) and the other one of which is a tunnelling layer (i.e., a layer of a material through which the charge is to be tunnelled to the charge-trapping layer). The tunnelling layer may include an insulator material such as a material that includes silicon and oxygen (e.g., silicon oxide), or any other suitable insulator. The charge-trapping layer may include a metal or a semiconductor material that is configured to trap charges. For example, a material that includes silicon and nitrogen (e.g., silicon nitride) may be used in/as a charge-trapping layer. Because the trapped charges may be kept in a charge-trapping arrangement for some time even in the absence of an electric field, such arrangements may be used to implement memory cells. Because the presence and/or the amount of trapped charges in a charge-trapping arrangement depends on the previous state, such arrangements are hysteretic arrangements. Memory technology where logic states are stored in terms of the amount of charge trapped in a hysteretic arrangement may be referred to as "charge-trapping memory."

Hysteretic memories have the potential for adequate non-volatility, short programming time, low power consumption, high endurance, and high-speed writing. In addition, hysteretic memories may be manufactured using processes compatible with the standard complementary metal-oxide-semiconductor (CMOS) technology. Therefore, over the last few years, these types of memories have emerged as promising candidates for many growing applications.

The performance of a hysteretic memory cell may depend on the number of factors. One factor is the ability of a cell to prevent or minimize detrimental effects of voltages which may unintentionally disturb a polarization state or a trapped charge that the cell is supposed to hold. Unlike ferromagnetic cores which have square-like hysteresis loops with sharp transitions around their coercive points, as is desirable for memory implementations, hysteresis loops of hysteretic materials/arrangements may not always have sharp transitions which means that even relatively small voltages can inadvertently disturb their polarization states. One approach to address this issue could be to improve processing techniques for creating hysteretic materials/arrangements in an attempt to realize square-like hysteresis loops. Another approach is to overcome this shortcoming of the materials by employing creative circuit architectures, e.g., by using access transistors to control access to hysteretic memory cells.

Embodiments of the present disclosure may improve on at least some of the challenges and issues of existing memory arrays by increasing the number of active memory layers, to generate a vertically stacked hysteretic memory using fewer masks and at a lower cost. In particular, embodiments of the present disclosure provide various arrangements for IC devices implementing memory with one access transistor for multiple hysteretic capacitors are disclosed. As used herein, a capacitor is referred to as a "hysteretic capacitor" if, instead of or in addition to a conventional dielectric material, the capacitor includes a hysteretic material or a hysteretic arrangement as a capacitor insulator that separates first and second capacitor electrodes. An individual one of the multiple hysteretic capacitors may store a memory state, thus realizing a memory cell of a memory array. An example memory unit of an IC device implementing memory with one access transistor for multiple hysteretic capacitors includes an access transistor and N hysteretic capacitors coupled to the access transistor in a way that allows selecting all of the N hysteretic capacitors for performing READ and/or WRITEs operation when the access transistor is ON (e.g., when current may be conducted between source and drain terminals of the access transistor). An example IC device includes a memory array of M of such memory units, as well as W wordlines, B bitlines, and P platelines, where any of variables N, M, W, B, and P may be any integer greater than 1. An IC device may be provided on a support structure such as a substrate, a die, a wafer, or a chip, and, in various arrangements disclosed herein, various hysteretic capacitors and platelines may be arranged in different layers with respect to the support structure than layers in which wordlines and/or bitlines are implemented, thus realizing a three-dimensional (3D) stacked architecture of the memory array. Incorporating hysteretic capacitors and platelines in different layers with respect to a support structure may allow significantly increasing density of memory cells in a memory array having a given footprint area (the footprint area being defined as an area in a plane of the support structure, or a plane parallel to the plane of the support structure, i.e., the x-y plane of the example coordinate system shown in the present drawings), or, conversely, allow significantly reducing the footprint area of the memory array with a given density of memory cells. IC devices implementing memory with one access transistor for multiple hysteretic capacitors as described herein may be used to address the scaling challenges of conventional 1T-1C memory technology and enable high-density embedded memory compatible with advanced CMOS processes.

Other aspects of IC devices fabricated using hybrid manufacturing of access transistors for memory are described herein with reference to non-hysteretic memory arrangements and corresponding methods and devices, e.g., with reference to 1T-1C memory that uses dielectric materials that are not FE/ADE materials. IC devices implementing memory with one access transistor for a single non-hysteretic capacitor as described herein may be used to enable high-performance embedded memory compatible with advanced CMOS processes.

In the following, descriptions are provided with respect to capacitors (either hysteretic or non-hysteretic) and platelines provided in different layers above a support structure, compared to the layers in which wordlines and bitlines are provided (i.e., the capacitors, platelines, wordlines, and bitlines are described to be in certain layers above a given side of the support structure, e.g., above the front side of the support structure). However, in general, these descriptions are equally applicable to embodiments where some of the capacitors, platelines, wordlines, and bitlines are provided in one or more layers on the front side of the support structure and other ones are provided in one or more layers on the back side of the support structure, all of which embodiments being within the scope of the present disclosure. In the context describing various layers in the present disclosure, the term "above" may refer to a layer being further away from a support structure of an IC device, while the term "below" refers to a layer being closer to the support structure. Although descriptions of the present disclosure may refer to logic devices or memory cells provided in a given layer, each layer of the IC devices described herein may also include other types of devices besides logic or memory devices described herein. For example, in some embodiments, IC devices implementing memory with one access transistor for multiple capacitors cells may also include non-hysteretic memory cells, or any other type of memory cells, or components other than memory cells (e.g., logic devices such as logic transistors) in any of the layers.

As used herein, a "memory state" (or, alternatively, a "logic state," a "state," or a "bit" value) of a memory cell refers to one of a finite number of states that the cell can have, e.g., logic states "1" and "0." When any of the memory cells as described herein use a hysteretic material such as a FE or an AFE material, in some embodiments, a logic state of the memory cell may be represented simply by presence or absence of polarization of a FE or an AFE material in a certain direction (for example, for a two-state memory where a memory cell can store one of only two logic states—one logic state representing the presence of polarization in a certain direction and the other logic state representing the absence of polarization in a certain direction). In other embodiments of memory cells that include hysteretic materials such as FE or AFE materials, a logic state of a memory cell may be represented by the amount of polarization of a FE or an AFE material in a certain direction (for a multi-state memory where a memory cell can store one of three or more logic states, where different logic states represent the presence of different amounts of polarization in a certain direction). When any of the memory cells as described herein use a charge-trapping hysteretic arrangement, in some embodiments, a logic state of a memory cell may be represented simply by presence or absence of charge trapped in a charge-trapping hysteretic arrangement (for example, for a two-state memory where a memory cell can store one of only two logic states—one logic state representing the presence of charge and the other logic state representing the absence of charge). In other embodiments of memory cells that include charge-trapping hysteretic arrangements, a logic state of a memory cell may be represented by the amount charge trapped in a charge-trapping hysteretic arrangement (for example, for a multi-state memory where a memory cell can store one of three or more logic states, where different logic states represent the presence of different amounts of trapped charges). As used herein, "READ" and "WRITE" memory access or operations refer to, respectively, determining/sensing a logic state of a memory cell and programming/setting a logic state of a memory cell.

In the following detailed description, various aspects of the illustrative implementations may be described using terms commonly employed by those skilled in the art to convey the substance of their work to others skilled in the art. For example, some descriptions may refer to a particular S/D region of a transistor being either a source region or a drain region. However, unless specified otherwise, which region of a transistor is considered to be a source region and which region is considered to be a drain region is not important because, as is common in the field of field-effect transistors (FETs), designations of source and drain are often interchangeable. Therefore, descriptions of some illustrative embodiments of the source and drain regions provided herein are applicable to embodiments where the designation of source and drain regions may be reversed.

As used herein, the term "connected" means a direct electrical or magnetic connection between the things that are connected, without any intermediary devices, while the term "coupled" means either a direct electrical or magnetic connection between the things that are connected, or an indirect connection through one or more passive or active intermediary devices. The term "circuit" means one or more passive and/or active components that are arranged to cooperate with one another to provide a desired function. If used, the terms "oxide," "carbide," "nitride," etc. refer to compounds containing, respectively, oxygen, carbon, nitrogen, etc., the term "high-k dielectric" refers to a material having a higher dielectric constant (k) than silicon oxide, while the term "low-k dielectric" refers to a material having a lower k than silicon oxide. The terms "substantially," "close," "approximately," "near," and "about," generally refer to being within +/−20%, e.g., within +/−5% or within +/−2%, of a target value based on the context of a particular value as described herein or as known in the art. Similarly, terms indicating orientation of various elements, e.g., "coplanar," "perpendicular," "orthogonal," "parallel," or any other angle between the elements, generally refer to being within +/−5-20% of a target value based on the context of a particular value as described herein or as known in the art.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening layers.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C).

The description may use the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. Unless otherwise specified, the use of the ordinal adjectives "first," "second," and "third," etc., to describe a common object, merely indicate that different instances of like objects are being referred to and are not intended to imply that the objects so described must be in a given sequence, either temporally, spatially, in ranking or in any other manner.

In the following detailed description, reference is made to the accompanying drawings that form a part hereof, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense. For convenience, analogous elements designated in the present drawings with different reference numerals after a dash, e.g., capacitor layers 106-1, 106-2, and so on may be referred to together without the reference numerals after the dash, e.g., as "capacitor layers 106." In order to not clutter the drawings, if multiple instances of certain elements are illustrated, only some of the elements may be labeled with a reference sign.

In the drawings, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined using e.g., scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region, and/or occasional dislocation defects of single atoms or clusters of atoms. There may be other defects not listed here but that are common within the field of device fabrication. Inspection of layout and mask data and reverse engineering of parts of a device to reconstruct the circuit using e.g., optical microscopy, TEM, or SEM, and/or inspection of a cross-section of a device to detect the shape and the location of various device elements described herein using, e.g., Physical Failure Analysis (PFA) would allow determination of presence of IC devices fabricated using hybrid manufacturing of access transistors for memory as described herein.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

Various IC devices fabricated using hybrid manufacturing of access transistors for memory as described herein may be implemented in, or associated with, one or more components associated with an IC or/and may be implemented between various such components. In various embodiments, components associated with an IC include, for example, transistors, diodes, power sources, resistors, capacitors, inductors, sensors, transceivers, receivers, antennas, etc. Components associated with an IC may include those that are mounted on IC or those connected to an IC. The IC may be either analog or digital and may be used in a number of applications, such as microprocessors, optoelectronics, logic blocks, audio amplifiers, etc., depending on the components associated with the IC. The IC may be employed as part of a chipset for executing one or more related functions in a computer.

FIG. 1 provides a block diagram of an IC device 100 fabricated using hybrid manufacturing of access transistors for memory, according to some embodiments of the present disclosure. As shown in FIG. 1, the IC device 100 may include a support structure 102, a first transistor circuit 104-1 over a first portion of the support structure 102, and a second transistor circuit 104-2 over a second portion of the support structure 102. One or more capacitor layers 106, shown in FIG. 1 with an example of two capacitor layers 106-1 and 106-2, may be provided over the first transistor circuit 104-1, so that the first transistor circuit 104-1 is between the support structure 102 and the one or more capacitor layers 106.

Implementations of the present disclosure may be formed or carried out on any suitable support structure 102, such as a substrate, a die, a wafer, or a chip. The support structure 102 may, e.g., be the wafer 2000 of FIG. 12, discussed below, and may be, or be included in, a die, e.g., the singulated die 2002 of FIG. 12, discussed below. The support structure 102 may be a semiconductor substrate composed of semiconductor material systems including, for example, N-type or P-type materials systems. In one implementation, the semiconductor substrate may be a crystalline substrate formed using a bulk silicon or a silicon-on-insulator (SOI) substructure. In other implementations, the semiconductor substrate may be formed using alternate materials, which may or may not be combined with silicon, that include, but are not limited to, germanium, silicon germanium, indium antimonide, lead telluride, indium arsenide, indium phosphide, gallium arsenide, aluminum gallium arsenide, aluminum arsenide, indium aluminum arsenide, aluminum indium antimonide, indium gallium arsenide, gallium nitride, indium gallium nitride, aluminum indium nitride or gallium antimonide, or other combinations of group III-V materials (e.g., materials from groups III and V of the periodic system of elements), group II-VI (e.g., materials from groups II and IV of the periodic system of elements), or group IV materials (e.g., materials from group IV of the periodic system of elements). In some embodiments, the substrate may be non-crystalline. In some embodiments, the support structure 102 may be a printed circuit board (PCB) substrate. Although a few examples of materials from which the support structure 102 may be formed are described here, any material that may serve as a foundation upon which an IC device with transistors having angled gates as described herein may be built falls within the spirit and scope of the present disclosure. As used herein, the term "support structure" does not necessarily mean that it provides mechanical support for the IC devices/structures (e.g., transistors, capacitors, interconnects, and so on) built thereon. For example, some other structure (e.g., a carrier substrate or a package substrate) may provide such mechanical support and the support structure 102 may provide material "support" in that, e.g., the IC devices/structures are build based on the semiconductor materials of the support structure 102. However, in some embodiments, the support structure 102 may provide mechanical support.

One or both of the first and second transistor circuits 104 of the IC device 100 may include transistors that may serve as access transistors of a memory array for which the capacitors of the capacitor layers 106 are storage elements, thus realizing embedded memory. In some embodiments, the access transistors of the first and second transistor circuits 104 may be provided by different manufacturers. In some embodiments, the capacitors of the one or more capacitor layers 106 may be provided by a different manufacturer than that providing the first and/or second transistor circuits 104. In various embodiments, transistors of the first and second transistor circuits 104 may be transistors of different transistor architectures. For example, transistors of the first transistor circuit 104-1 and transistors of the second transistor circuit 104-2 may be of different transistor architectures selected from a set of a recess channel array transistor (RCAT) architecture, a fin-based transistor architecture, a nanoribbon-based transistor architecture, a nanosheet-based transistor architecture, and a nanowire-based transistor architecture, as known in the art.

In some embodiments, individual transistors of the first transistor circuit 104-1 may be coupled to individual capacitors of the one or more capacitor layers 106, thus forming a plurality of memory units. In some embodiments, individual memory units of any of the memory arrays described herein may include one access transistor coupled to one and only one capacitor, e.g., as explained with reference to FIG. 2. Thus, in some embodiments, the IC device 100 may include a 1T-1C memory array with memory units that include one of the transistors of the first transistor circuit 104-1 and one of the capacitors of the one or more capacitor layers 106. In other embodiments, individual memory units of any of the memory arrays described herein may include one access transistor coupled to two or more capacitors, e.g., as explained with reference to FIGS. 3-8. Thus, in some embodiments, the IC device 100 may include a 1T-many C memory array with memory units that include one of the transistors of the first transistor circuit 104-1 and several of the capacitors of the one or more capacitor layers 106.

In some embodiments, the second transistor circuit 104-2 may be a peripheral logic circuit for the plurality of memory units formed by the transistors of the first transistor circuit 104-1 and the one or more capacitor layers 106. In other embodiments, the second transistor circuit 104-2 may further include storage elements coupled to the transistors of the second transistor circuit 104-2, thus realizing a memory array that is different of that implemented by the first transistor circuit 104-1 and the one or more capacitor layers 106. For example, the first transistor circuit 104-1 and the one or more capacitor layers 106 may implement high-density memory, such as memory with one access transistor for multiple hysteretic capacitors as described with reference to FIGS. 3-8, while the second transistor circuit 104-2 may implement high-performance memory, such as 1T-1C memory as described with reference to FIG. 2. In another example, the first transistor circuit 104-1 and the one or more capacitor layers 106 may implement memory with one access transistors of the first transistor circuit 104-1 coupled to one or more capacitors of the one or more capacitor layers 106, while the second transistor circuit 104-2 may implement memory such as resistive switching memory (e.g., magnetoresistive random-access memory (MRAM) or resistive random-access memory (RRAM)), spin-transfer torque random-access memory (STTRAM) cells, static random-access memory (SRAM), or memory of any other memory architecture.

In some embodiments, the IC device 100 may be fabricated by hybrid bonding of separate IC structures together. In general, hybrid manufacturing is described herein with reference to a first IC structure (e.g., one containing the support structure 102 and the first transistor circuit 104-1) and a second IC structure (e.g., one containing the capacitor layer 106-1 or a plurality of capacitor layers 106) bonded to one another using a bonding material. The first and second IC structures may be fabricated by different manufacturers, using different materials, or different manufacturing techniques. For each IC structure, the terms "bottom face" or "backside" of the structure may refer to the back of the IC structure, e.g., bottom of the support structure of a given IC structure, while the terms "top face" or "frontside" of the structure may refer to the opposing other face. When the top face of the first IC structure is bonded to the top face of the second IC structure, the structures are described as bonded "face-to-face" (f2f). When the top face of the first IC structure is bonded to the bottom face of the second IC structure or the bottom face of the first IC structure is bonded to the top face of the second IC structure, the structures are described as bonded "face-to-back" (f2b). When the bottom face of the first IC structure is bonded to the bottom face of the second IC structure, the structures are described as bonded "back-to-back" (b2b).

As a result of performing hybrid bonding, one or more bonding interfaces 108 may be present in the IC device 100. Only one instance of such bonding interface 108 is labeled with a reference numeral in FIG. 1, even though several example locations of the bonding interfaces 108 are shown in FIG. 1. For example, the IC device 100 illustrates that a bonding interface 108 may be present between the support structure 102 and the first transistor circuit 104-1, between the support structure 102 and the second transistor circuit 104-2, between the first transistor circuit 104-1 and the closest capacitor layer (i.e., the capacitor layer 106-1), and between the capacitor layer 106-1 and the capacitor layer 106-2.

In some embodiments, bonding of the faces of the first and second IC structures may be performing using insulator-insulator bonding, e.g., as oxide-oxide bonding, where an insulating material of the first IC structure is bonded to an insulating material of the second IC structure. In some embodiments, a bonding material may be present in between the faces of the first and second IC structures that are bonded together (e.g., any of the bonding interfaces 108 in the IC device 100 may include a bonding material). To that end, the bonding material may be applied to the one or both faces of the first and second IC structures that should be bonded and then the first and second IC structures are put together, possibly while applying a suitable pressure and heating up the assembly to a suitable temperature (e.g., to moderately high temperatures, e.g., between about 50 and 200 degrees Celsius) for a duration of time. In some embodiments, the bonding material may be an adhesive material that ensures attachment of the first and second IC structures to one another. In some embodiments, the bonding material may be an etch-stop material. In some embodiments, the bonding material may be both an etch-stop material and have suitable adhesive properties to ensure attachment of the first and second IC structures to one another. In some embodiments, the bonding material may include silicon, nitrogen, and carbon, where the atomic percentage of any of these materials may be at least 1%, e.g., between about 1% and 50%, indicating that these elements are added deliberately, as opposed to being accidental impurities which are typically in concentration below about 0.1%. Having both nitrogen and carbon in these concentrations in addition to silicon is not typically used in conventional semiconductor manufacturing processes where, typically, either nitrogen or carbon is used in combination with silicon, and, therefore, could be a characteristic feature of the hybrid bonding. Using an etch-stop material at the interface (i.e., the interface between the first and second IC structures) that includes include silicon, nitrogen, and carbon, where the atomic percentage of any of these materials may be at least 1%, e.g., SiOCN, may be advantageous in terms that such a material may act both as an etch-stop material, and have sufficient adhesive properties to bond the first and second IC structures together. In addition, an etch-stop material at the interface between the first and second IC structures that includes include silicon, nitrogen, and carbon, where the atomic percentage of any of these materials may be at least 1%, may be advantageous in terms of improving etch-selectivity of this material with respect to etch-stop materials that may be used in different of the first and second IC structures.

In some embodiments, no bonding material may be used, but there will still be a bonding interface (e.g., any of the bonding interfaces 108 of the IC device 100) resulting from the bonding of the first and second IC structures to one another. Such a bonding interface may be recognizable as a seam or a thin layer in the microelectronic assembly, using, e.g., selective area diffraction (SED), even when the specific materials of the insulators of the first and second IC structures that are bonded together may be the same, in which case the bonding interface would still be noticeable as a seam or a thin layer in what otherwise appears as a bulk insulator (e.g., bulk oxide) layer.

In some embodiments, one or more of the signal vias or the power vias may be provided in the IC device 100 after two or more different IC structures have been bonded together. In such embodiments, such signal or power vias provided after the bonding may extend from one face of one of the IC structures towards and into another IC structure and may extend through the bonding interface 108, to provide signal and/or power to various IC components (e.g., transistors) of the individual IC structures. One example of this is shown in FIG. 1 with a via 110 extending from the top face of the capacitor layer 106-2, through the capacitor layer 106-2 and into the first transistor circuit 104-1. Another example of this is shown in FIG. 1 with a via 110 extending from the top face of the second transistor circuit 104-2 and into the support structure 102. In other embodiments, such after-bonding vias may extend through any one or more of other bonding interfaces 108 that may be present in the IC device 100.

In various embodiments, one or more of the bonding interfaces 108 shown in FIG. 1 may be absent. In some embodiments, none of the bonding interfaces 108 shown in FIG. 1 are present in the IC device 100 because, e.g., various component of the IC device 100 are monolithically integrated over the support structure 102.

Figure 2:
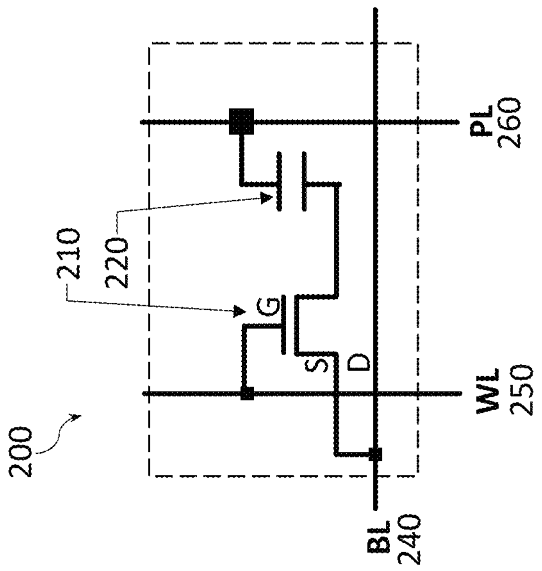
FIG. 2 provides an electric circuit diagram of a memory cell with one access transistor for a single capacitor, according to some embodiments of the present disclosure.

FIG. 2 provides an electric circuit diagram of a memory cell 200 (i.e., a memory unit) with one access transistor for a single capacitor (i.e., an 1T-1C memory cell), according to some embodiments of the present disclosure.

A plurality of the memory cells 200 may be provided on any of the memory dies 106 that are implemented as dynamic random-access memory (DRAM) dies, e.g., on any of the memory dies 106 shown in FIG. 1.

As shown in FIG. 2, the 1T-1C cell 200 may include an access transistor 210 and a storage element in the form of a capacitor 220. The access transistor 210 has a gate terminal, a source terminal, and a drain terminal, indicated in the example of FIG. 2 as terminals G, S, and D, respectively. In the following, the terms "terminal" and "electrode/contact" may be used interchangeably. Furthermore, for S/D terminals, the terms "terminal" and "region" may be used interchangeably.

As shown in FIG. 2, in the 1T-1C cell 200, the gate terminal of the access transistor 210 may be coupled to a WL 250, one of the S/D terminals of the access transistor 210 may be coupled to a bitline (BL) 240, and the other one of the S/D terminals of the access transistor 210 may be coupled to a first electrode of the capacitor 220. As also shown in FIG. 2, the other electrode of the capacitor 220 may be coupled to a capacitor plateline (PL) 260 (also sometimes referred to as a "select-line" (SL)). As is known in the art, WL, BL, and PL may be used together to read and program the capacitor 220. Each of the BL 240, the WL 250, and the PL 260, as well as intermediate elements coupling these lines to various terminals described herein, may be formed of any suitable electrically conductive material, which may include an alloy or a stack of multiple electrically conductive materials. In various embodiments, such electrically conductive materials may include one or more metals or metal alloys, with metals such as copper, aluminum, ruthenium, palladium, platinum, cobalt, nickel, hafnium, zirconium, titanium, and tantalum, and/or one or more oxides or carbides of such metals or metal alloys.

In some embodiments, the access transistor 210 may be a thin-film transistor (TFT). In other embodiments, the access transistor 210 may be not a TFT, e.g., a transistor formed based on an epitaxially grown semiconductor material. For example, in some such embodiments, the access transistor 210 may be a FinFET, a nanowire, or a nanoribbon transistor.

Non-TFT-based memory cells may be particularly suitable if it is desirable to have the transistors of the memory cells with channel regions formed of substantially single-crystalline semiconductor materials, in which case the semiconductor materials of the channel materials are epitaxially grown. On the other hand, in TFT-based memory cells, the semiconductor materials of the channel materials are deposited, as opposed to being epitaxially grown, in which case the channel regions may include polycrystalline, polymorphous, or amorphous semiconductor materials, or various other thin-film channel materials. Whether a semiconductor material of a channel region for a given transistor (e.g., an access transistor of a memory cell, e.g., the access transistor 210) has been epitaxially grown or deposited can be identified by inspecting grain size of the material. An average grain size of a semiconductor material in a channel region of a transistor being between about 0.05 and 1 millimeters (in which case the material may be considered to be polycrystalline) or smaller than about 0.05 millimeter (in which case the material may be considered to be polymorphous) may be indicative of the semiconductor material having been deposited, in which case the transistor is a TFT. On the other hand, an average grain size of the semiconductor material being equal to or greater than about 1 millimeter (in which case the material may be considered to be a single-crystal material) may be indicative of the semiconductor material having been epitaxially grown (which, in general, is a process performed at substantially higher temperatures than those at which thin-film semiconductor materials may be deposited for TFTs).

For any of the TFTs described herein, a channel region may be composed of semiconductor material systems including, for example, N-type or P-type materials systems. In some embodiments, the channel region of a TFT may include a high mobility oxide semiconductor material, such as tin oxide, antimony oxide, indium oxide, indium tin oxide, titanium oxide, zinc oxide, indium zinc oxide, indium gallium zinc oxide (IGZO), gallium oxide, titanium oxynitride, ruthenium oxide, or tungsten oxide. In general, the channel region of a TFT may include one or more of tin oxide, cobalt oxide, copper oxide, antimony oxide, ruthenium oxide, tungsten oxide, zinc oxide, gallium oxide, titanium oxide, indium oxide, titanium oxynitride, indium tin oxide, indium zinc oxide, nickel oxide, niobium oxide, copper peroxide, IGZO, indium telluride, molybdenite, molybdenum diselenide, tungsten diselenide, tungsten disulfide, N- or P-type amorphous or polycrystalline silicon, germanium, indium gallium arsenide, silicon germanium, gallium nitride, aluminum gallium nitride, indium phosphite, and black phosphorus, each of which may possibly be doped with one or more of gallium, indium, aluminum, fluorine, boron, phosphorus, arsenic, nitrogen, tantalum, tungsten, and magnesium, etc. In particular, the channel region of a TFT may be a thin-film material. Some such materials may be deposited at relatively low temperatures, which allows depositing them within the thermal budgets imposed on backend fabrication to avoid damaging the frontend components. In some embodiments, the channel region of a TFT may have a thickness between about 5 and 75 nanometers, including all values and ranges therein.

For any of the transistors that are not TFTs described herein, a channel region may be composed of semiconductor material systems including, for example, N-type or P-type materials systems. In some embodiments, the channel region of a non-TFT may include a high mobility oxide semiconductor material, such as tin oxide, antimony oxide, indium oxide, indium tin oxide, titanium oxide, zinc oxide, indium zinc oxide, gallium oxide, titanium oxynitride, ruthenium oxide, or tungsten oxide. In some embodiments, the channel region of a non-TFT may include a combination of semiconductor materials. In some embodiments, the channel region of a non-TFT may include a monocrystalline semiconductor, such as silicon (Si) or germanium (Ge). In some embodiments, the channel region of a non-TFT may include a compound semiconductor with a first sub-lattice of at least one element from group III of the periodic table (e.g., Al, Ga, In), and a second sub-lattice of at least one element of group V of the periodic table (e.g., P, As, Sb). For some example N-type transistor embodiments (i.e., for the embodiments where the transistor is an N-type metal-oxide-semiconductor (NMOS) transistor), the channel region may advantageously include a III-V material having a high electron mobility, such as, but not limited to InGaAs, InP, InSb, and InAs. For some such embodiments, the channel region may be a ternary III-V alloy, such as InGaAs, GaAsSb, InAsP, or InPSb. For some InxGa1-xAs fin embodiments, In content (x) may be between 0.6 and 0.9, and may advantageously be at least 0.7 (e.g., In0.7Ga0.3As). In some embodiments with highest mobility, the channel region of a non-TFT may be an intrinsic III-V material, i.e., a III-V semiconductor material not intentionally doped with any electrically active impurity. In alternate embodiments, a nominal impurity dopant level may be present within the channel region, for example to further fine-tune a threshold voltage Vt of the transistor, to provide HALO pocket implants, etc. Even for impurity-doped embodiments however, impurity dopant level within the channel region may be relatively low, for example below $10^{15}$ dopant atoms per cubic centimeter ($cm^{-3}$), and advantageously below $10^{13}$ $cm^{-3}$. For some example P-type transistor embodiments (i.e., for the embodiments where the transistor is a P-type metal-oxide-semiconductor (PMOS) transistor), the channel region may advantageously be a group IV material having a high hole mobility, such as, but not limited to Ge or a Ge-rich SiGe alloy. For some example embodiments, the channel region may have a Ge content between 0.6 and 0.9, and advantageously may be at least 0.7. In some embodiments with highest mobility, the channel region may be intrinsic III-V (or IV for P-type devices) material and not intentionally doped with any electrically active impurity. In alternate embodiments, one or more a nominal impurity dopant level may be present within the channel region, for example to further set a threshold voltage (Vt), or to provide HALO pocket implants, etc. Even for impurity-doped embodiments however, impurity dopant level within the channel region is relatively low, for example below $10^{15}$ $cm^{-3}$, and advantageously below $10^{13}$ $cm^{-3}$.

Thin-film semiconductor materials typically have larger bandgaps and, therefore, are less temperature sensitive, than epitaxially grown semiconductor materials. Therefore, in some embodiments, channel regions of the transistors of the TFT-based memory cells include a first semiconductor material, channel regions of the transistors of the non-TFT memory cells include a second semiconductor material, and a bandgap of the first semiconductor material is larger than a bandgap of the second semiconductor material.

Figure 3:
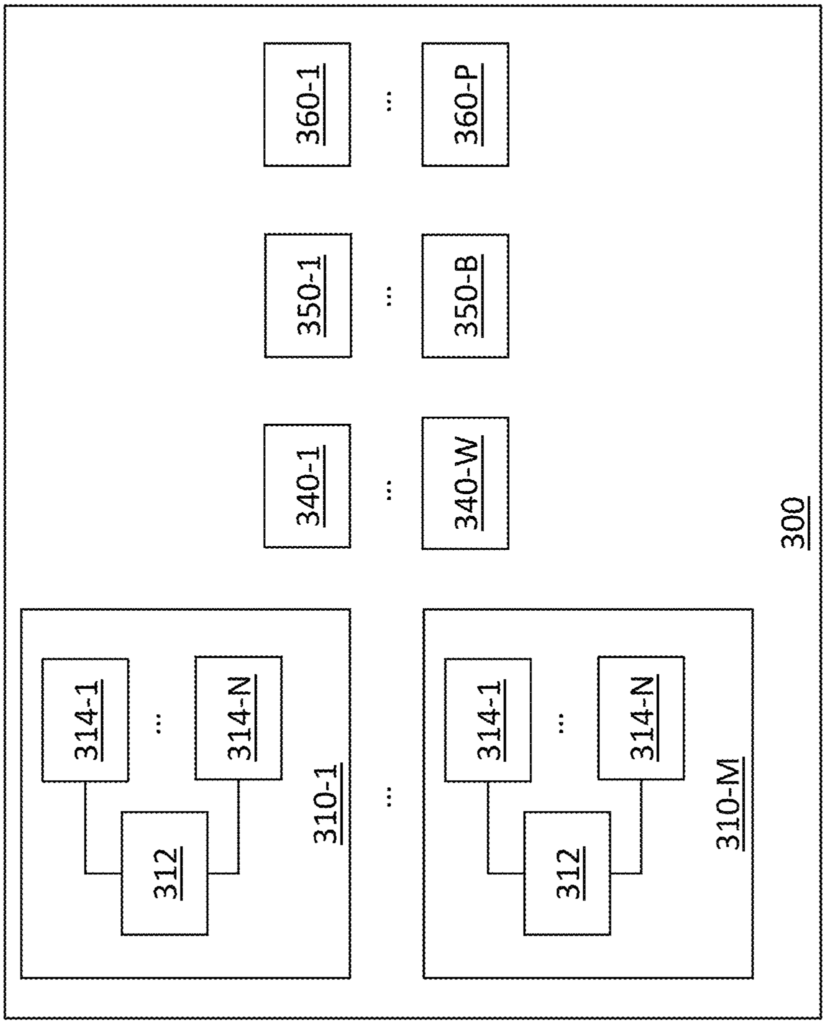
FIG. 3 provides a block diagram of an IC device implementing memory with one access transistor for multiple hysteretic capacitors, according to some embodiments of the present disclosure.

FIG. 3 provides a block diagram of an IC device 300 implementing memory with one access transistor for multiple hysteretic capacitors, according to some embodiments of the present disclosure. As shown in FIG. 3, the IC device 300 includes M memory units 310, labeled as memory units 310-1 through 310-M. Each of the memory units 310 includes an access transistor 312 and a plurality of hysteretic capacitors 314 coupled to the access transistor 312. The hysteretic capacitors 314 of each of the memory units 310 are labeled in FIG. 3 as capacitors 314-1 through 314-N, although, in general, different memory units 310 may include different number of hysteretic capacitors (i.e., unlike the illustration of FIG. 3 may suggest, in other embodiments of the IC device 300, not all of the memory units 310 include N hysteretic capacitors 314). As further shown in FIG. 3, the IC device 300 may also include W wordlines 340, labeled as wordlines 340-1 through 340-W, B bitlines 350, labeled as bitlines 350-1 through 350-B, and P platelines 360, labeled as platelines 360-1 through 360-P.

In general, any of variables N, M, W, B, and P may be any integer greater than 1 and may be different from one another, although in some specific embodiments two of more of these variables may be of the same value (e.g., the number of wordlines 340 may be equal to the number of bitlines 350, i.e., W=B in some embodiments). In some embodiments, the value of one of these variables depends on the value of one or more of the other ones of these variables (e.g., in various embodiments, the number of platelines 360 may depend on one or more of the number of wordlines 340, the number of bitlines 350, and the number of capacitors 314 in each of the memory units 310). The following convention is used in some of the subsequent drawings and in the present descriptions to refer to different instances of the wordlines 340, bitlines 350, and platelines 360 of the IC device 300. An individual wordline 340 is labeled in some of the subsequent drawings as $WL_i$, where i is an integer between 1 and W, identifying one of the W wordlines 340. An individual bitline 350 is labeled in some of the subsequent drawings as $BL_j$, where j is an integer between 1 and B, identifying one of the B bitlines 350. An individual capacitor 314 within a given memory unit 310 is labeled in some of the subsequent drawings as $CAP_k$, where k is an integer between 1 and N, identifying one of the N capacitors 314. An individual plateline 360 is labeled in some of the subsequent drawings with one or two indices that may depend on the arrangement of the wordlines 340 and the bitlines 350, and to which one of the N capacitors 314 the plateline 360 is coupled to, such one or two indices identifying one of the P platelines 360. A three-dimensional tensor may then be defined, where indices i, j, and k of a given element of the tensor uniquely identify each of the capacitors 314 of the IC device 300 in terms of a unique combination of a wordline 340-*i* and a bitline 350-*j* to which the memory unit 310 of a given capacitor 314 belongs to, in combination with a unique identification of the capacitor 314-*k* within that memory unit 310. Because each capacitor 314 may be used to store a logic state, thus serving as a memory cell of the IC device 300, such a tensor may be used to uniquely identify each memory cell of the IC device 300.

Figure 4A:
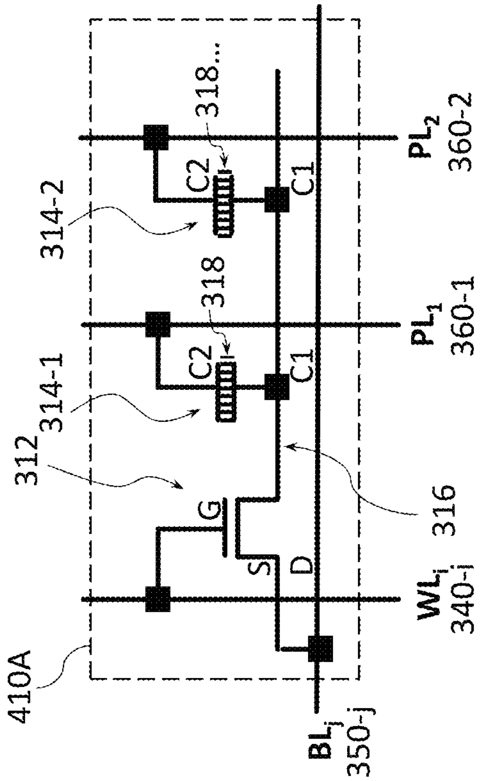
FIGS. 4A-4B provide electric circuit diagrams of a memory unit with an access transistor and multiple hysteretic capacitors coupled to, respectively, respective (i.e., different) platelines and a single plateline, according to some embodiments of the present disclosure.
Figure 4B:
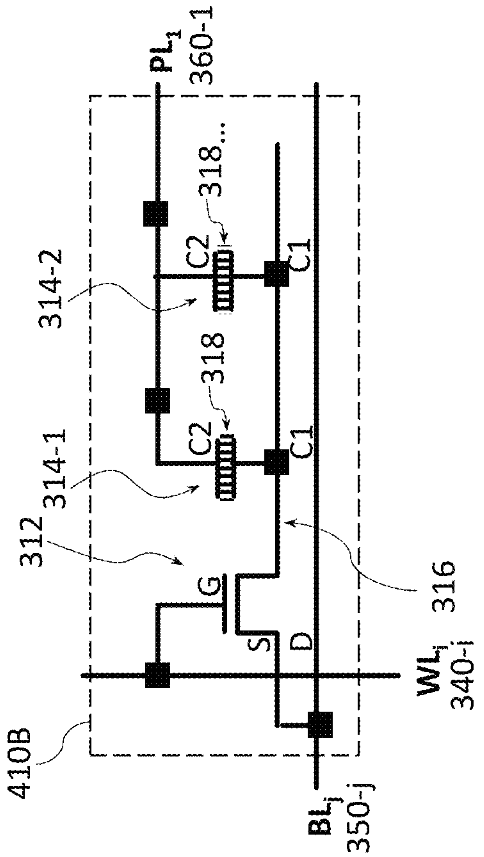

FIGS. 4A-4B provide electric circuit diagrams of a memory unit 410 with an access transistor and multiple hysteretic capacitors coupled to, respectively, different platelines and a single plateline, according to some embodiments of the present disclosure. Each of the memory units 310 of the IC device 300 may be implemented as the memory unit 410A as shown in FIG. 4A or as the memory unit 410B as shown in FIG. 4B.

As shown in FIGS. 4A-4B, the access transistor 312 may be a FET, having a gate terminal, a source terminal, and a drain terminal, labeled in the example of FIGS. 4A-4B as terminals G, S, and D, respectively. As further shown in FIGS. 4A-4B, the gate terminal of the access transistor 312 may be coupled to a wordline 340-*i*, one of the source or drain regions (e.g., a first S/D region) of the access transistor 312 may be coupled to a bitline 350-*j*, and the other one of the source or drain regions (e.g., a second S/D region) of the access transistor 312 may be coupled, via an intermediate node 316, to a first capacitor electrode (labeled in the example of FIGS. 4A-4B as C1) of each of the N capacitors 314 of the memory unit 410 (only two such capacitors are shown in FIGS. 4A-4B, but the possibility of additional capacitors 314 is illustrated in FIGS. 4A-4B with three dots to the right side of the capacitor 314-2). As is commonly known, designations of “source” and “drain” may be interchangeable in transistors. Therefore, while the examples of FIGS. 4A-4B illustrates that the access transistor 312 is coupled to each of the N capacitors 314 by its drain terminal, in other embodiments, any one of a source or a drain terminal of the access transistor 312 may be coupled to the first capacitor electrode of each of the N capacitors 314. A source and a drain terminal of a transistor is sometimes referred to in the following as a “transistor terminal pair”

and a "first terminal" of a transistor terminal pair is used to describe, for the access transistor 312, the terminal that is connected to the BL, while a "second terminal" is used to describe the source or drain terminal of the access transistor that is connected to the first capacitor electrode of each of the N capacitors 314.

In some embodiments, the access transistors 312 of the IC device 300 may be implemented as transistors having a non-planar architecture. Examples of transistors having a non-planar architecture include double-gate transistors, tri-gate transistors, FinFETs, and nanoribbon-based transistors. In comparison to a planar architecture where the transistor channel has only one confinement surface, a non-planar architecture is any type of architecture where the transistor channel has more than one confinement surfaces. A confinement surface refers to a particular orientation of the channel surface that is confined by the gate field. Non-planar transistors potentially improve performance relative to transistors having a planar architecture, such as single-gate transistors.

Where the memory units 410A and 410B differ from one another is in what the other, second, capacitor electrode (labeled in the example of FIGS. 4A-4B as C2) of the N capacitors 314 may be coupled to. In particular, FIG. 4A illustrates an embodiment where different ones of the N capacitors 314 of the memory unit 410 are coupled to respective (i.e., different) platelines 360 (i.e., FIG. 4A shows that the second capacitor electrode of the capacitor 314-1 is coupled to the plateline 360-1, the second capacitor electrode of the capacitor 314-2 is coupled to the plateline 360-2, and so on), while FIG. 4B illustrates an embodiment where different ones of the N capacitors 314 of the memory unit 410 are all coupled to a single (i.e., shared) platelines 360 (i.e., FIG. 4B shows that each of the second capacitor electrode of the capacitor 314-1, the second capacitor electrode of the capacitor 314-2, and so on, is coupled to the plateline 360-1).

Each of the WL 340, the BL 350, and the PL 360, as well as intermediate elements coupling these lines to various terminals described herein, may be formed of any suitable electrically conductive material, which may include an alloy or a stack of multiple electrically conductive materials. In some embodiments, such electrically conductive materials may include one or more metals or metal alloys, with metals such as ruthenium, palladium, platinum, cobalt, nickel, hafnium, zirconium, titanium, tantalum, and aluminum. In some embodiments, such electrically conductive materials may include one or more electrically conductive alloys oxides or carbides of one or more metals.

As shown in FIGS. 4A-4B, in some embodiments, instead of, or in addition to, a regular dielectric material used in conventional dielectric (i.e., not hysteretic) capacitors, each of the capacitors 314 may include a hysteretic material or a hysteretic arrangement, which, together, may be referred to as a "hysteretic element 318." In such embodiments, the capacitors 314 may be described as "hysteretic capacitor." The hysteretic element 318 used as a capacitor insulator of any of the capacitors 314 may have a thickness that may, in some embodiments, be between about 0.5 nanometers and 10 nanometers, including all values and ranges therein (e.g., between about 1 and 8 nanometers, or between about 0.5 and 5 nanometers).

In some embodiments, the hysteretic element 318 may be provided as a layer of a FE or an AFE material. Such an FE/AFE material may include one or more materials that can exhibit sufficient FE/AFE behavior even at thin dimensions, e.g., such as an insulator material at least about 5%, e.g., at least about 7% or at least about 10%, of which is in an orthorhombic phase and/or a tetragonal phase (e.g., as a material in which at most about 95-90% of the material may be amorphous or in a monoclinic phase). For example, such materials may be based on hafnium and oxygen (e.g., hafnium oxides), with various dopants added to ensure sufficient amount of an orthorhombic phase or a tetragonal phase. Some examples of such materials include materials that include hafnium, oxygen, and zirconium (e.g., hafnium zirconium oxide (HfZrO, also referred to as HZO)), materials that include hafnium, oxygen, and silicon (e.g., silicon-doped (Si-doped) hafnium oxide), materials that include hafnium, oxygen, and germanium (e.g., germanium-doped (Ge-doped) hafnium oxide), materials that include hafnium, oxygen, and aluminum (e.g., aluminum-doped (Al-doped) hafnium oxide), and materials that include hafnium, oxygen, and yttrium (e.g., yttrium-doped (Y-doped) hafnium oxide). However, in other embodiments, any other materials which exhibit FE/AFE behavior at thin dimensions may be used as the hysteretic elements 318 and are within the scope of the present disclosure.

In other embodiments, the hysteretic element 318 may be provided as a stack of alternating layers of materials that can trap charges. In some such embodiments, the stack may be a two-layer stack, where one layer is a charge-trapping layer and the other layer is a tunnelling layer. The tunnelling layer may include an insulator material such as a material that includes silicon and oxygen (e.g., silicon oxide), or any other suitable insulator. The charge-trapping layer may include an electrically conductive material such as a metal, or a semiconductor material. In some embodiments, the charge-trapping layer may include a material that includes silicon and nitrogen (e.g., silicon nitride). In general, any material that has defects that can trap charge may be used in/as a charge-trapping layer. Such defects are very detrimental to operation of logic devices and, therefore, typically, deliberate steps need to be taken to avoid presence of the defects. However, for memory devices, such defects are desirable because charge-trapping may be used to represent different memory states of a memory cell.

In some embodiments of the hysteretic element 318 being provided as a stack of alternating layers of materials that can trap charges, the stack may be a three-layer stack where an insulator material is provided on both sides of a charge-trapping layer. In such embodiments, a layer of an insulator material on one side of the charge-trapping layer may be referred to as a "tunnelling layer" while a layer of an insulator material on the other side of the charge-trapping layer may be referred to as a "field layer."

In various embodiments of the hysteretic element 318 being provided as a stack of alternating layers of materials that can trap charges, a thickness of each layer the stack may be between about 0.5 and 10 nanometers, including all values and ranges therein, e.g., between about 0.5 and 5 nanometers. In some embodiment of a three-layer stack, a thickness of each layer of the insulator material may be about 0.5 nanometers, while a thickness of the charge-trapping layer may be between about 1 and 8 nanometers, e.g., between about 2.5 and 7.5 nanometers, e.g., about 5 nanometers. In some embodiments, a total thickness of the hysteretic element 318 provided as a stack of alternating layers of materials that can trap charges (i.e., a hysteretic arrangement) may be between about 1 and 10 nanometers, e.g., between about 2 and 8 nanometers, e.g., about 6 nanometers.

FIGS. 3-6 provide electric circuit diagrams of example arrangements of various components of the IC device 300.

What FIGS. 3-6 have in common is that each of the memory units 310 (in particular, the access transistor 312 of each of the memory units 310) is coupled to a unique combination of one of the wordlines 340 and one of the bitlines 350. Since there are W wordlines 340 and B bitlines 350, this means that the IC device 300 illustrated in each of FIGS. 3-6 include W×B memory units 310 (i.e., M=W×B for the illustrations of FIGS. 3-6). Different memory units 310 may be coupled to a single wordline 340 and such memory units 310 may be referred to as belonging to a single "row" of memory units. Different memory units 310 may be coupled to a single bitline 350 and such memory units 310 may be referred to as belonging to a single "column" of memory units. Since each of the memory units 310 is coupled to a unique combination of a wordline 340-*i* and a bitline 350-*j*, individual memory units 310 are labeled in FIGS. 3-6 as memory units 310-*ij* and access transistors 312 within those memory units are labeled as transistors 312-*ij*, where i identifies the wordline 340-*i* to which the memory unit 310-*ij* is coupled (i.e., i identifies the row to which the memory unit 310 belongs) and j identifies the bitline 350-*j* to which the memory unit 310-*ij* is coupled (i.e., j identifies the column to which the memory unit 310 belongs). Similarly, intermediate nodes 316 of the individual memory units 310 are labeled in FIGS. 3-6 as 316-*ij*.

Figure 5:
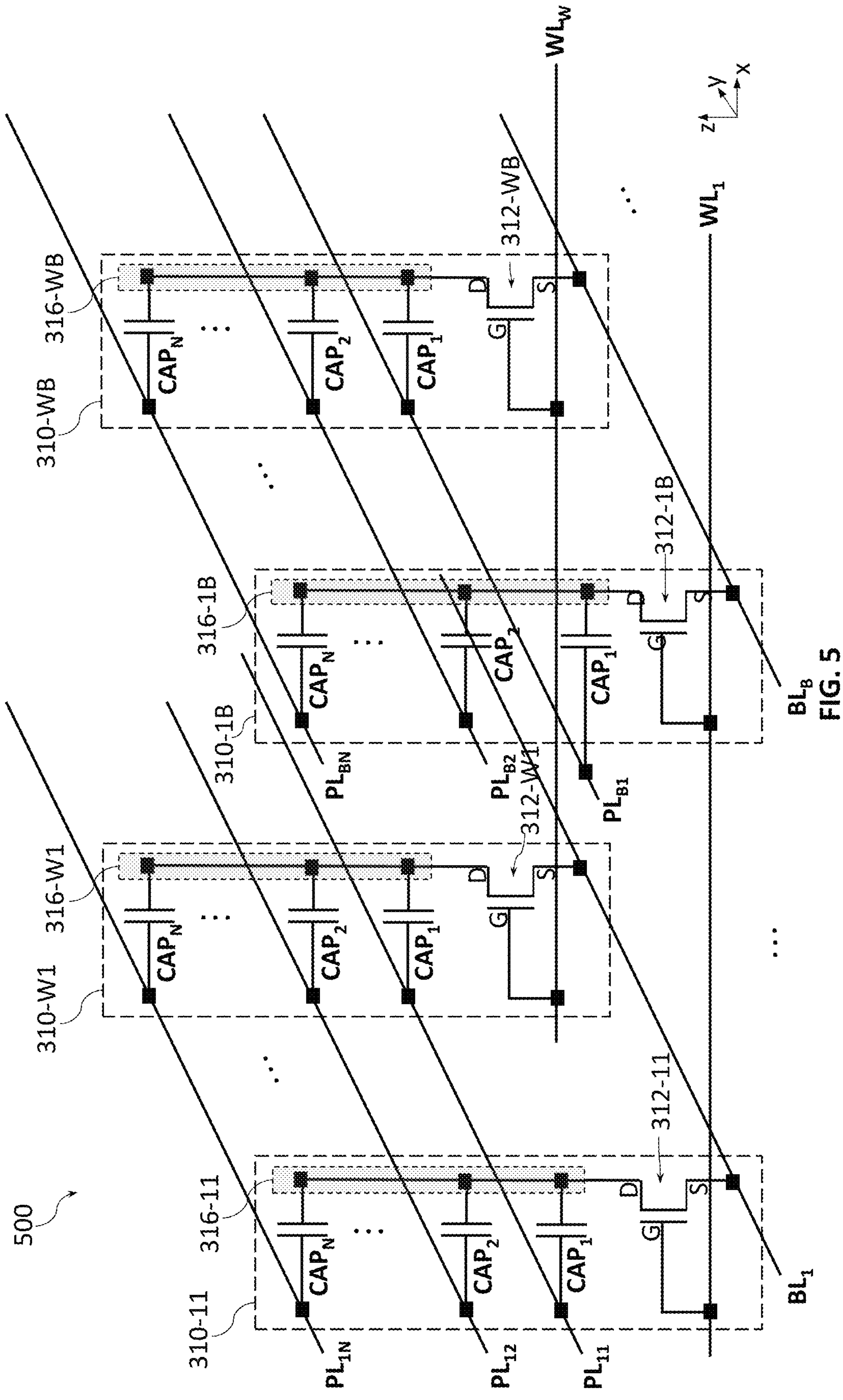
FIG. 5 provides an electric circuit diagram of an IC device where each plateline is shared among multiple wordlines and, in each memory unit, different ones of multiple hysteretic capacitors are coupled to different platelines, according to some embodiments of the present disclosure.
Figure 6:
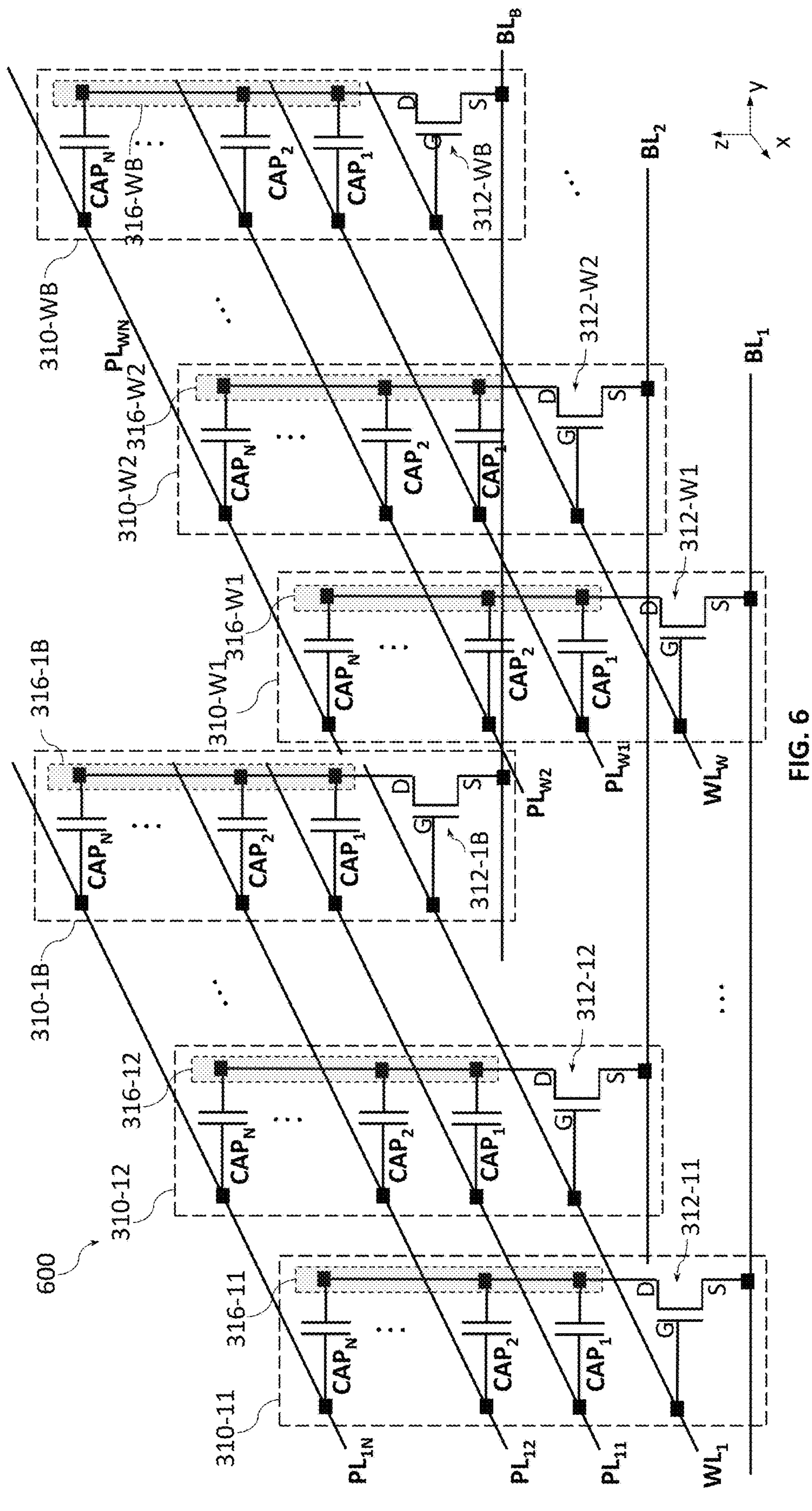
FIG. 6 provides an electric circuit diagram of an IC device where each plateline is shared among multiple bitlines and, in each memory unit, different ones of multiple hysteretic capacitors are coupled to different platelines, according to some embodiments of the present disclosure.
Figure 7:
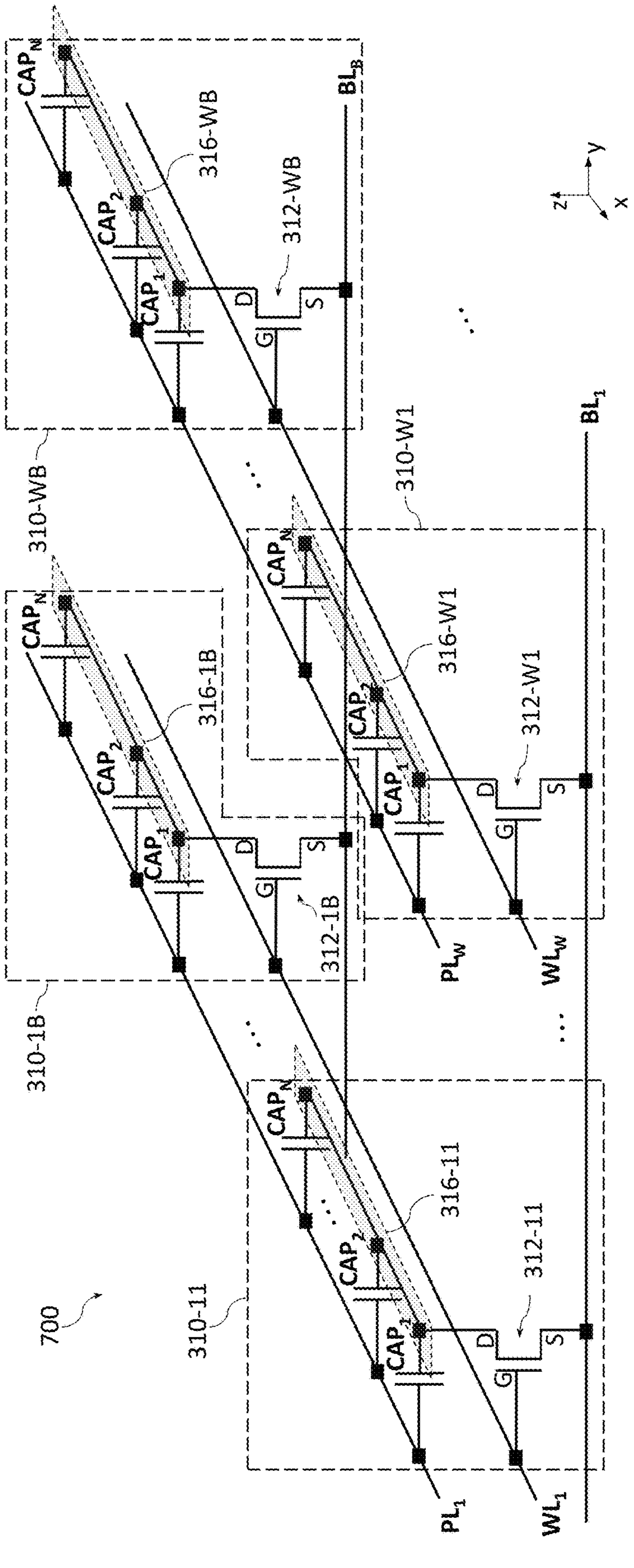
FIG. 7 provides an electric circuit diagram of an IC device where each plateline is shared among multiple bitlines and, in each memory unit, different ones of multiple hysteretic capacitors are coupled to a single plateline, according to some embodiments of the present disclosure.
Figure 8:
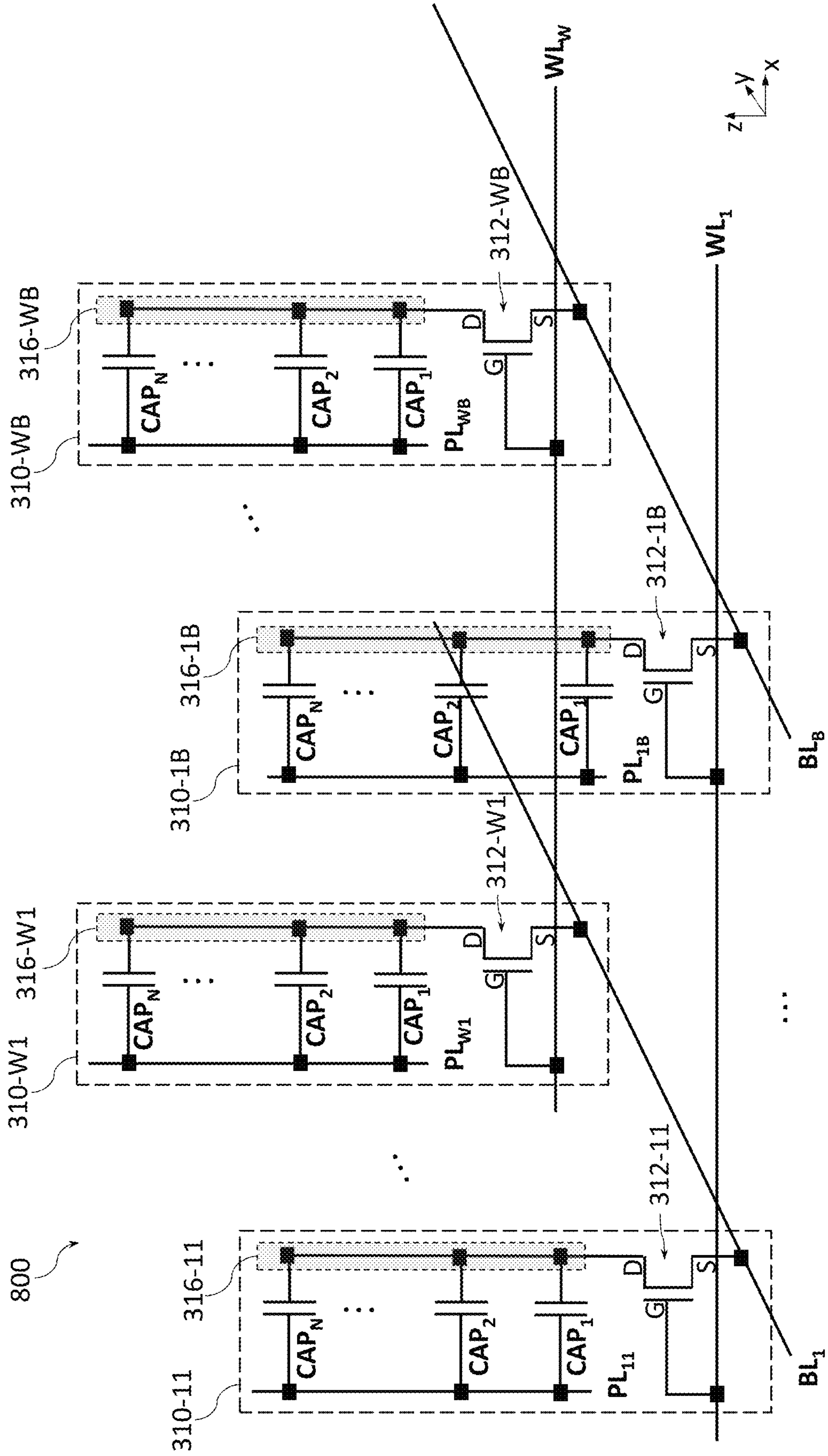
FIG. 8 provides an electric circuit diagram of an IC device where each plateline corresponds to a different unique combination of a wordline and a bitline and, in each memory unit, different ones of multiple hysteretic capacitors are coupled to a single plateline, according to some embodiments of the present disclosure.

What FIGS. 3-6 also have in common is that each memory unit 310 is illustrated in FIGS. 3-6 to have N hysteretic capacitors 314, which means that the IC devices 300 illustrated in each of FIGS. 3-6 include W×B×N memory cells, when each hysteretic capacitor 314 is considered to be a memory cell. The embodiments of FIGS. 3-6 differ in whether N capacitors 314 of a given memory unit 310 are coupled to different platelines 360 (e.g., as shown in FIG. 5 and FIG. 6) or to a single shared plateline 360 (e.g., as shown in FIG. 7 and FIG. 8), and in whether a single plateline 360 is shared among multiple wordlines 340 (e.g., among all W of the wordlines 340, as shown in FIG. 5) or whether a single plateline 360 is shared among multiple bitlines 350 (e.g., among all B of the bitlines 350, as shown in FIG. 6 and FIG. 7) or whether a single respective plateline is associated with each of the memory units 310 (e.g., as shown in FIG. 8).

Each of FIGS. 3-6 illustrates individual capacitors 314 of the IC device units 310 arranged in a 3D array in different orientations with respect to wordlines 340, bitlines 350, and platelines 360. In particular, each of FIGS. 3-6 illustrates W wordlines 340 extending along an x-axis of an example coordinate system shown in these drawings and B bitlines 350 extending along a y-axis of the example coordinate system shown (i.e., wordlines 340 are oriented perpendicular to the bitlines 350). Each of FIG. 5, FIG. 6, and FIG. 8 illustrates individual ones of the N capacitors 314 of each of the memory units being stacked above one another along a z-axis of the example coordinate system shown, while FIG. 7 illustrates individual ones of the N capacitors 314 of each of the memory units extending along the x-axis of the example coordinate system shown. FIG. 5 illustrates platelines 360 extending along the y-axis of the example coordinate system shown, i.e., projections of the platelines 360 onto any plane that is parallel the support structure over which the IC device 300 is provided are oriented parallel to the projections of the bitlines 350 onto the same plane and perpendicular to the projections of the wordlines 340 onto the same plane. For that reason, embodiment of FIG. 5 is described as an embodiment where platelines are parallel to bitlines. Each of FIG. 6 and FIG. 7 illustrates platelines 360 extending along the x-axis of the example coordinate system shown, i.e., projections of the platelines 360 onto any plane that is parallel the support structure over which the IC device 300 is provided are oriented parallel to the projections of the wordlines 340 onto the same plane and perpendicular to the projections of the bitlines 350 onto the same plane. For that reason, embodiments of FIG. 6 and FIG. 7 are described as embodiments where platelines are parallel to wordlines. FIG. 8 illustrates platelines 360 extending along the z-axis of the example coordinate system shown, i.e., the platelines 360 are substantially perpendicular to any plane that is parallel the support structure over which the IC device 300 is provided. For that reason, embodiment of FIG. 8 is described as an embodiment where platelines are vertical.

In some implementations, the relative orientations of wordlines 340, bitlines 350, and platelines 360 as shown in FIG. 5-6 may be representative of actual physical orientations of these control lines in the actual physical layout of the IC devices 300. For example, in some implementations, the wordlines 340 may indeed be routed as metal lines substantially parallel to one another and substantially perpendicular to the bitlines 350. In another example, in some implementations, the platelines 360 may indeed be routed as metal lines substantially parallel to one another and to the bitlines 350. However, in other implementations, any of the wordlines 340, bitlines 350, and platelines 360 may be oriented in the actual physical layout of the IC devices 300 in any manner that allows realizing the electrical connections as described with reference to FIGS. 3-6. The support structure over which the IC device 300 is provided may, e.g., the support structure 102, described above.

FIG. 5 provides an electric circuit diagram of an IC device 500 that is an example of the IC device 300 where each plateline 360 is shared among multiple wordlines 340 and, in each of the memory units 310, N hysteretic capacitors 314 are coupled to respective (i.e., different) platelines 360, according to some embodiments of the present disclosure. Thus, in the IC device 500, the platelines 360 are parallel to the bitlines 350 and multiple hysteretic capacitors 314 coupled to a given bitline 350-*j* are coupled to respective (i.e., different) platelines 360-*j*1 through 360-jN, as explained in greater detail below.

In the IC device 500, each of the memory units 310 is implemented as the memory unit 410A of FIG. 4A, i.e., where, within a single memory unit 310, N platelines 360 are coupled, in a one-to-one correspondence, to respective ones of the N capacitors 314. For example, as shown in FIG. 5, for the memory unit 310-11 (i.e., an instance of the memory unit 410A that is coupled to the wordline $WL_1$ and the bitline $BL_1$, as shown in FIG. 5), a plateline $PL_{11}$ is coupled to the second capacitor electrode of the capacitor $CAP_1$, a plateline $PL_{12}$ is coupled to the second capacitor electrode of the capacitor $CAP_2$, and so on until a plateline $PL_{1N}$ is coupled to the second capacitor electrode of the capacitor $CAP_N$. In another example, as also shown in FIG. 5, for the memory unit 310-1B (i.e., an instance of the memory unit 410A that is coupled to the wordline $WL_1$ and the bitline $BL_B$, as shown in FIG. 5), a plateline $PL_{B1}$ is coupled to the second capacitor electrode of the capacitor $CAP_1$, a plateline $PL_{B2}$ is coupled to the second capacitor electrode of the capacitor $CAP_2$, and so on until a plateline $PL_{BN}$ is coupled to the second capacitor electrode of the capacitor $CAP_N$.

FIG. 5 illustrates an embodiment where the platelines 360 are parallel to the bitlines 350, meaning that a single plateline 360 is shared among multiple wordlines 340. This is illustrated in FIG. 5 with the plateline $PL_{11}$, coupled to the second capacitor electrode of the capacitor $CAP_1$ of the memory unit 310-11, extending further to couple to the second capacitor electrode of the capacitor $CAP_1$ of other memory units 310 coupled to the same bitline (i.e., the bitline $BL_1$). For example, FIG. 5 illustrates that the plateline $PL_{11}$ is also coupled to the second capacitor electrode of the capacitor $CAP_1$ of the last memory unit 310-W1 coupled to the bitline $BL_1$ (the memory units 310 between the first and the last memory units coupled to the bitline are not shown in FIG. 5 but are represented by triple dots between the first and the last memory units; the same notation holds for other drawings and other elements of the IC device 300 not specifically shown in FIGS. 3-6). Similarly, the plateline $PL_{12}$, coupled to the second capacitor electrode of the capacitor $CAP_2$ of the memory unit 310-11, extends further to couple to the second capacitor electrode of the capacitor $CAP_2$ of other memory units 310 coupled to the bitline $BL_1$, and so on, until the plateline $PL_{12}$ couples to the second capacitor electrode of the capacitor $CAP_2$ of the last memory unit 310-W1 coupled to the bitline as shown in FIG. 5. Furthermore, FIG. 5 illustrates that the plateline $PL_{1N}$, coupled to the second capacitor electrode of the capacitor $CAP_N$ of the memory unit 310-11, extends further to couple to the second capacitor electrode of the capacitor $CAP_N$ of other memory units 310 coupled to the bitline $BL_1$, and so on, until the plateline $PL_{1N}$ couples to the second capacitor electrode of the capacitor $CAP_N$ of the last memory unit 310-W1 coupled to the bitline $BL_1$, as shown in FIG. 5.

Thus, in the IC device 500, corresponding capacitors 314 of the memory units 310 coupled to a single bitline 350-*j* (i.e., of the memory units 310 that belong to the column j) are coupled to a single plateline 360, where the capacitors 314 of different memory units 310 are described as "corresponding" when they have the same index k identifying them. For example, in the IC device 500, capacitor $CAP_1$ of the memory unit 310-11, capacitor $CAP_1$ of the memory unit 310-21, and so on until capacitor $CAP_1$ of the memory unit 310-W1 are corresponding capacitors, each coupled to the plateline $P_{11}$ and included in different memory units 310 of column 1; capacitor $CAP_2$ of the memory unit 310-11, capacitor $CAP_2$ of the memory unit 310-21, and so on until capacitor $CAP_2$ of the memory unit 310-W1 are corresponding capacitors, each coupled to the plateline $P_{12}$ and included in different memory units 310 of column 1; and so on up to capacitor $CAP_N$ of the memory unit 310-11, capacitor $CAP_N$ of the memory unit 310-21, and so on until capacitor $CAP_N$ of the memory unit 310-W1 also being corresponding capacitors, each coupled to the plateline $P_{1N}$ and included in different memory units 310 of column 1. The memory units 310 to which the platelines $P_{11}$ to $P_{1N}$ of the IC device 500 are coupled are memory units 310 of the column 1 (i.e., memory units 310 coupled to the bitline $BL_1$). In another example, in the IC device 500, capacitor $CAP_1$ of the memory unit 310-1B, capacitor $CAP_1$ of the memory unit 310-2B, and so on until capacitor $CAP_1$ of the memory unit 310-WB are corresponding capacitors, each coupled to the plateline $P_{B1}$ and included in different memory units 310 of column B; capacitor $CAP_2$ of the memory unit 310-1B, capacitor $CAP_2$ of the memory unit 310-2B, and so on until capacitor $CAP_2$ of the memory unit 310-WB are corresponding capacitors, each coupled to the plateline $P_{B2}$ and included in different memory units 310 of column B; and so on up to capacitor $CAP_N$ of the memory unit 310-1B, capacitor $CAP_N$ of the memory unit 310-2B, and so on until capacitor $CAP_N$ of the memory unit 310-WB also being corresponding capacitors, each coupled to the plateline $P_{BN}$ and included in different memory units 310 of column B. The memory units 310 to which the platelines $P_{B1}$ to $P_{BN}$ of the IC device 500 are coupled are memory units 310 of the column B (i.e., memory units 310 coupled to the bitline BL B). Thus, in the IC device 500, memory units 310 of different columns (i.e., memory units 310 coupled to different bitlines 350) are coupled to respective different sets of N platelines 360. More generally, in the IC device 500, a memory unit 310-*ij*, coupled to the wordline WL, and to the bitline $BL_j$, is coupled to a set of platelines $PL_{j1}$ through $PL_{jN}$, where, more specifically, each capacitor $CAP_k$ of the memory unit 310-*ij* is coupled to a corresponding plateline $PL_{jk}$. In such an arrangement, the total number of platelines 360 in the IC device 500 is B×N.

In the IC device 500, each capacitor 314 may be addressed (i.e., selected for READ and WRITE operations) by a unique combination of a wordline $WL_i$, a bitline $BL_j$, and a plateline $PL_{jk}$. In the context of the present disclosure, a combination of control lines is described as "unique" when the combination differs from all other combinations in at least one control line being different. For example, in the IC device 500, the capacitor $CAP_2$ of the memory unit 310-11 may be addressed by a combination of the wordline $WL_1$ (i.e., i=1), the bitline $BL_1$ (i.e., j=1), and the plateline $PL_{12}$ (i.e., j=1 and k=2), while the capacitor $CAP_2$ of the memory unit 310-W1 may be addressed by a combination of the wordline $WL_W$ (i.e., i=W), the bitline $BL_1$ (i.e., j=1), and the plateline $PL_{12}$ (i.e., j=1 and k=2). While the bitlines 350 and the platelines 360 in these two combinations are the same (i.e., $BL_1$ and $PL_{12}$ for each of the two combinations), the wordlines 340 are different (i.e., $WL_1$ in the first combination and $WL_W$ in the second combination), making these combinations unique with respect to one another. In another example for the IC device 500, the capacitor $CAP_2$ of the memory unit 310-11 may be addressed by a combination of the wordline $WL_1$ (i.e., i=1), the bitline $BL_1$ (i.e., j=1), and the plateline $PL_{12}$ (i.e., j=1 and k=2), while the capacitor $CAP_2$ of the memory unit 310-1B may be addressed by a combination of the wordline $WL_1$ (i.e., i=1), the bitline $BL_B$ (i.e., j=13), and the plateline $PL_{B2}$ (i.e., j=B and k=2). While the wordlines 340 in these two combinations are the same (i.e., $WL_1$ for each of the two combinations), the bitlines 350 and the platelines 360 are different (i.e., respectively, $BL_1$ and $PL_{12}$ in the first combination and, respectively, $BL_B$ and $PL_{B2}$ in the second combination), making these combinations unique with respect to one another. In yet another example for the IC device 500, the capacitor $CAP_2$ of the memory unit 310-11 may be addressed by a combination of the wordline $WL_1$ (i.e., i=1), the bitline $BL_1$ (i.e., j=1), and the plateline $PL_{12}$ (i.e., j=1 and k=2), while the capacitor $CAP_N$ of the memory unit 310-11 may be addressed by a combination of the wordline $WL_1$ (i.e., i=1), the bitline $BL_1$ (i.e., j=1), and the plateline $PL_{1N}$ (i.e., j=1 and k=N). While the wordlines 340 and the bitlines 350 in these two combinations are the same (i.e., $WL_1$ and $BL_1$ for each of the two combinations), the platelines 360 are different (i.e., $PL_{12}$ in the first combination and $PL_{1N}$ in the second combination), making these combinations unique with respect to one another. Having each capacitor 314 of the IC device 300 being addressed by a unique combination of a wordline $WL_i$, a bitline $BL_j$, and a plateline $PL_{jk}$, e.g., as is the case with the IC device 500, advantageously allows performing READ and WRITE operations on different memory cells (i.e., on different capacitors 314) independently of one another.

FIG. 6 provides an electric circuit diagram of an IC device 600 where each plateline 360 is shared among multiple bitlines 350 and, in each of the memory units 310, N hysteretic capacitors 314 are coupled to respective (i.e., different) platelines 360, according to some embodiments of the present disclosure. Thus, in the IC device 600, the platelines 360 are parallel to the wordlines 340 and multiple hysteretic capacitors 314 coupled to a given wordline 340-*i* are coupled to respective (i.e., different) platelines 360-*i*1 through 360-iN, as explained in greater detail below.

In the IC device 600, each of the memory units 310 is implemented as the memory unit 410A of FIG. 4A, i.e., where, within a single memory unit 310, N platelines 360 are coupled, in a one-to-one correspondence, to respective ones of the N capacitors 314. This is similar to the IC device 500, except that FIG. 6 illustrates an embodiment where the platelines 360 are parallel to the wordlines 340, meaning that a single plateline 360 is shared among multiple bitlines 350. This is illustrated in FIG. 6 with the plateline $PL_{11}$, coupled to the second capacitor electrode of the capacitor $CAP_1$ of the memory unit 310-11, extending further to couple to the second capacitor electrode of the capacitor $CAP_1$ of other memory units 310 coupled to the same wordline (i.e., the wordline $WL_1$). For example, FIG. 6 illustrates that the plateline $PL_{11}$ is also coupled to the second capacitor electrode of the capacitor $CAP_1$ of the second memory unit 310-12 coupled to the wordline $WL_1$ and so on, until the plateline $PL_{11}$ is also coupled to the second capacitor electrode of the capacitor $CAP_1$ of the last memory unit 310-1B coupled to the wordline $WL_1$. Similarly, the plateline $PL_{12}$, coupled to the second capacitor electrode of the capacitor $CAP_2$ of the memory unit 310-11, extends further to couple to the second capacitor electrode of the capacitor $CAP_2$ of other memory units 310 coupled to the wordline $WL_1$, and so on, until the plateline $PL_{12}$ couples to the second capacitor electrode of the capacitor $CAP_2$ of the last memory unit 310-1B coupled to the wordline $WL_1$, as shown in FIG. 6. Furthermore, FIG. 6 illustrates that that the plateline $PL_{1N}$, coupled to the second capacitor electrode of the capacitor $CAP_N$ of the memory unit 310-11, extends further to couple to the second capacitor electrode of the capacitor $CAP_N$ of other memory units 310 coupled to the wordline $WL_1$, and so on, until the plateline $PL_{1N}$ couples to the second capacitor electrode of the capacitor $CAP_N$ of the last memory unit 310-1B coupled to the wordline $WL_1$.

Thus, in the IC device 600, corresponding capacitors 314 of the memory units 310 coupled to a single wordline 340-*i* (i.e., of the memory units 310 that belong to the row i) are coupled to a single plateline 360, where, as described above, the capacitors 314 of different memory units 310 are described as "corresponding" when they have the same index k identifying them. For example, in the IC device 600, capacitor $CAP_1$ of the memory unit 310-11, capacitor $CAP_1$ of the memory unit 310-12, and so on until capacitor $CAP_1$ of the memory unit 310-1B are corresponding capacitors, each coupled to the plateline $P_{11}$ and included in different memory units 310 of row 1; capacitor $CAP_2$ of the memory unit 310-11, capacitor $CAP_2$ of the memory unit 310-12, and so on until capacitor $CAP_2$ of the memory unit 310-1B are corresponding capacitors, each coupled to the plateline $P_{12}$ and included in different memory units 310 of row 1; and so on up to capacitor $CAP_N$ of the memory unit 310-11, capacitor $CAP_N$ of the memory unit 310-21, and so on until capacitor $CAP_N$ of the memory unit 310-1B also being corresponding capacitors, each coupled to the plateline $P_{1N}$ and included in different memory units 310 of row 1. The memory units 310 to which the platelines $P_{11}$ to $P_{1N}$ of the IC device 600 are coupled are memory units 310 of the row 1 (i.e., memory units 310 coupled to the wordline $WL_1$). In another example, in the IC device 600, capacitor $CAP_1$ of the memory unit 310-W1, capacitor $CAP_1$ of the memory unit 310-W2, and so on until capacitor $CAP_1$ of the memory unit 310-WB are corresponding capacitors, each coupled to the plateline $P_{w1}$ and included in different memory units 310 of row W; capacitor $CAP_2$ of the memory unit 310-W1, capacitor $CAP_2$ of the memory unit 310-W2, and so on until capacitor $CAP_2$ of the memory unit 310-WB are corresponding capacitors, each coupled to the plateline $P_{w2}$ and included in different memory units 310 of row W; and so on up to capacitor $CAP_N$ of the memory unit 310-W1, capacitor $CAP_N$ of the memory unit 310-W2, and so on until capacitor $CAP_N$ of the memory unit 310-WB also being corresponding capacitors, each coupled to the plateline $P_{WN}$ and included in different memory units 310 of row W. The memory units 310 to which the platelines $P_{W1}$ to $P_{WN}$ of the IC device 600 are coupled are memory units 310 of the row W (i.e., memory units 310 coupled to the wordline $WL_W$). Thus, in the IC device 600, memory units 310 of different rows (i.e., memory units 310 coupled to different wordlines 340) are coupled to respective different sets of N platelines 360. More generally, in the IC device 600, a memory unit 310-*ij*, coupled to the wordline $WL_i$, and to the bitline $BL_j$, is coupled to a set of platelines $PL_{i1}$ through $PL_{iN}$, where, more specifically, each capacitor $CAP_k$ of the memory unit 310-*ij* is coupled to a corresponding plateline $PL_{ik}$. In such an arrangement, the total number of platelines 360 in the IC device 600 is W×N.

Similar to the IC device 500, in the IC device 600, each capacitor 314 may be addressed (i.e., selected for READ and WRITE operations) by a unique combination of a wordline $WL_i$, a bitline $BL_j$, and a plateline $PL_{ik}$. For example, in the IC device 600, the capacitor $CAP_2$ of the memory unit 310-11 may be addressed by a combination of the wordline $WL_1$ (i.e., i=1), the bitline $BL_1$ (i.e., j=1), and the plateline $PL_{12}$ (i.e., i=1 and k=2), while the capacitor $CAP_2$ of the memory unit 310-W1 may be addressed by a combination of the wordline $WL_W$ (i.e., i=W), the bitline $BL_1$ (i.e., j=1), and the plateline $PL_{12}$ (i.e., i=1 and k=2). While the bitlines 350 and the platelines 360 in these two combinations are the same (i.e., $BL_1$ and $PL_{12}$ for each of the two combinations), the wordlines 340 are different (i.e., $WL_1$ in the first combination and $WL_W$ in the second combination), making these combinations unique with respect to one another. In another example for the IC device 600, the capacitor $CAP_2$ of the memory unit 310-11 may be addressed by a combination of the wordline (i.e., i=1), the bitline $BL_1$ (i.e., j=1), and the plateline $PL_{12}$ (i.e., i=1 and k=2), while the capacitor $CAP_2$ of the memory unit 310-W1 may be addressed by a combination of the wordline $WL_W$ (i.e., i=W), the bitline $BL_1$ (i.e., j=1), and the plateline $PL_{W2}$ (i.e., i=W and k=2). While the bitlines 350 in these two combinations are the same (i.e., $BL_1$ for each of the two combinations), the wordlines 340 and the platelines 360 are different (i.e., respectively, $WL_1$ and $PL_{12}$ in the first combination and, respectively, $WL_W$ and $PL_{W2}$ in the second combination), making these combinations unique with respect to one another. In yet another example for the IC device 600, the capacitor $CAP_2$ of the memory unit 310-11 may be addressed by a combination of the wordline $WL_1$ (i.e., i=1), the bitline $BL_1$ (i.e., j=1), and the plateline $PL_{12}$ (i.e., i=1 and k=2), while the capacitor $CAP_N$ of the memory unit 310-11 may be addressed by a combination of the wordline $WL_1$ (i.e., i=1), the bitline $BL_1$ (i.e., j=1), and the plateline $PL_{1N}$ (i.e., i=1 and k=N). While the wordlines 340 and the bitlines 350 in these two combinations are the same (i.e., $WL_1$ and $BL_1$ for each of the two combinations), the platelines 360 are different (i.e., $PL_{12}$ in the first combination and $PL_{1N}$ in the second combination), making these combinations unique with respect to one another. Having each capacitor 314 of the IC device 300 being addressed by a unique combination of a wordline $WL_i$, a bitline $BL_j$, and a plateline $PL_{ik}$, e.g., as is the case with the IC device 600, advantageously allows performing READ and WRITE operations on different memory cells (i.e., on different capacitors 314) independently of one another.

FIG. 7 provides an electric circuit diagram of an IC device 700 where each plateline 360 is shared among multiple bitlines 350 and, in each of the memory units 310, N hysteretic capacitors 314 are coupled to a single (i.e., shared) plateline 360, according to some embodiments of the present disclosure. Thus, in the IC device 700, the platelines 360 are parallel to the wordlines 340 and multiple hysteretic capacitors 314 coupled to a given wordline 340-*i* are coupled to a single plateline PL, (i.e., these hysteretic capacitors 314 are shorted).

In the IC device 700, each of the memory units 310 is implemented as the memory unit 410B of FIG. 4B, i.e., where, within a single memory unit 310, a single plateline 360 is coupled, in a one-to-N correspondence, to all of the N capacitors 314. For example, as shown in FIG. 7, for the memory unit 310-11 (i.e., an instance of the memory unit 410B that is coupled to the wordline $WL_1$ and the bitline $BL_1$, as shown in FIG. 7), a plateline PL 1 is coupled to the second capacitor electrode of the capacitor $CAP_1$, the second capacitor electrode of the capacitor $CAP_2$, and so on, up to the second capacitor electrode of the capacitor $CAP_N$ the memory unit 310-11. In another example, as also shown in FIG. 7, for the memory unit 310-W1 (i.e., an instance of the memory unit 410B that is coupled to the wordline $WL_W$ and the bitline $BL_1$, as shown in FIG. 7), a plateline $PL_W$ is coupled to the second capacitor electrode of the capacitor $CAP_1$, the second capacitor electrode of the capacitor $CAP_2$, and so on, up to the second capacitor electrode of the capacitor $CAP_N$ of the memory unit 310-W1.

FIG. 7 illustrates an embodiment where the platelines 360 are parallel to the wordlines 340, meaning that a single plateline 360 is shared among multiple bitlines 350. This is illustrated in FIG. 7 with the plateline $PL_1$, coupled to the second capacitor electrode of each of the capacitors $CAP_1$ through $CAP_N$ of the memory unit 310-11, extending further to couple to the second capacitor electrode of each of the capacitors $CAP_1$ through $CAP_N$ of other memory units 310 coupled to the same wordline (i.e., the wordline $WL_1$). For example, FIG. 7 illustrates that the plateline $PL_1$ is further coupled to the second capacitor electrode of each of the capacitors $CAP_1$ through $CAP_N$ of the last memory unit 310-1B coupled to the wordline $WL_1$ (the memory units 310 between the first and the last memory units coupled to the wordline are not shown in FIG. 7 but are represented by triple dots between the first and the last memory units; the same notation holds for other drawings and other elements of the IC device 300 not specifically shown in FIGS. 3-6). Similarly, the plateline $PL_W$, coupled to the second capacitor electrode of each of the capacitors $CAP_1$ through $CAP_N$ of the memory unit 310-W1, extends further to couple to the second capacitor electrode of each of the capacitors $CAP_1$ through $CAP_N$ of other memory units 310 coupled to the wordline $WL_W$, as shown in FIG. 7. For example, FIG. 7 illustrates that the plateline $PL_W$ is further coupled to the second capacitor electrode of each of the capacitors $CAP_1$ through $CAP_N$ of the last memory unit 310-WB coupled to the wordline $WL_W$.

Thus, in the IC device 700, all N of the capacitors 314 of each of the memory units 310 coupled to a single wordline 340-*i* (i.e., of the memory units 310 that belong to the row i) are coupled to a single plateline 360-*i*. For example, in the IC device 700, all of the capacitors $CAP_1$ through $CAP_N$ of each of the memory units 310-11 through 310-1B are coupled to the plateline where each set of capacitors $CAP_1$ through $CAP_N$ is included in different memory units 310 of row 1. Similarly, all of the capacitors $CAP_1$ through $CAP_N$ of each of the memory units 310-W1 through 310-WB are coupled to the plateline Pw, where each set of capacitors $CAP_1$ through $CAP_N$ is included in different memory units 310 of row W. Thus, in the IC device 700, memory units 310 of different rows (i.e., memory units 310 coupled to different wordlines 340) are coupled to respective different platelines 360. More generally, in the IC device 700, a memory unit 310-*ij*, coupled to the wordline $WL_i$ and to the bitline $BL_j$, is coupled to a single plateline $PL_i$, where, more specifically, each capacitor $CAP_k$ of the memory unit 310-*ij* is coupled to the same plateline $PL_i$. In such an arrangement, the total number of platelines 360 in the IC device 700 is W.

In contrast to the IC device 500 and the IC device 600, in the IC device 700, not all capacitors 314 may be addressed by a unique combination of a wordline, a bitline, and a plateline. Rather, each N of the capacitors 314 of a memory unit 310-*ij* that is coupled to a wordline $WL_i$ and a bitline $BL_j$ are coupled to a single plateline $PL_i$, making the combination of the wordline $WL_i$, the bitline $BL_j$, and the plateline $PL_i$ the same (i.e., not unique) for each of the N capacitors 314 of this memory unit. Having each N of the capacitors 314 of a memory unit 310-*ij* of the IC device 300 being addressed by the same combination of a wordline $WL_i$, a bitline $BL_j$, and a plateline $PL_i$, e.g., as is the case with the IC device 700, does not allow performing READ and WRITE operations on different memory cells (i.e., on different capacitors 314) of a given memory unit 310 independently of one another. However, such implementations may be useful in deployment scenarios such as one-time-programming (OTP) where the individual capacitors of a given memory unit 310 may be pre-programmed differently in the design stage (e.g., during manufacture of the IC device 300) but then be addressed for READ and WRITE operations as a group. Such OTP implementations may, e.g., be used as a physical unclonable function (PUF) of the IC device 300. In such scenarios, the IC device 300 implemented as the IC device 700 may be advantageous in terms of, e.g., simpler fabrication.

FIG. 8 provides an electric circuit diagram of an IC device 800 where each plateline 360 corresponds to a different unique combination of a wordline 340 and a bitline 350 (i.e., none of the platelines 360 are shared among multiple wordlines 340 and none of the platelines 360 are shared among multiple bitlines 350) and, in each of the memory units 310, N hysteretic capacitors 314 are coupled to a single (i.e., shared) plateline 360, according to some embodiments of the present disclosure. Thus, in the IC device 800, the platelines 360 are "vertical" in that they are not shared among multiple wordlines 340 or multiple bitlines 350.

Similar to the IC device 700, in the IC device 800 each of the memory units 310 is implemented as the memory unit 410B of FIG. 4B, i.e., where, within a single memory unit 310, a single plateline 360 is coupled, in a one-to-N correspondence, to all of the N capacitors 314. For example, as shown in FIG. 8, for the memory unit 310-11 (i.e., an instance of the memory unit 410B that is coupled to the wordline $WL_1$ and the bitline $BL_1$, as shown in FIG. 8), a plateline $PL_1$ is coupled to the second capacitor electrode of the capacitor $CAP_1$, the second capacitor electrode of the capacitor $CAP_2$, and so on, up to the second capacitor electrode of the capacitor $CAP_N$ the memory unit 310-11. In another example, as also shown in FIG. 8, for the memory unit 310-W1 (i.e., an instance of the memory unit 410B that is coupled to the wordline $WL_W$ and the bitline $BL_1$, as shown in FIG. 7), a plateline $PL_W$ is coupled to the second capacitor electrode of the capacitor $CAP_1$, the second capacitor electrode of the capacitor $CAP_2$, and so on, up to the second capacitor electrode of the capacitor $CAP_N$ of the memory unit 310-W1.

In contrast to the IC device 700, in the IC device 800 the platelines 360 are not parallel to the wordlines 340, meaning that a single plateline 360 is not shared among multiple bitlines 350. The platelines 360 are also not parallel to the bitlines 350, meaning that a single plateline 360 is not shared among multiple wordlines 340. Instead, in the IC device 800, each of the platelines 360 corresponds to a unique combination of a particular wordline 340-*i* and a particular bitline 350-*j* used to address the capacitors 314 of the memory unit 310-*ij* to which the plateline 360 is coupled. This is illustrated in FIG. 8 with the plateline $PL_{11}$ being coupled to the second capacitor electrode of each of the capacitors $CAP_1$ through $CAP_N$ of the memory unit 310-11 (i.e., the plateline corresponds to a combination of the wordline $WL_1$ and the bitline $BL_1$), with the plateline $PL_{w1}$ being coupled to the second capacitor electrode of each of the capacitors $CAP_1$ through $CAP_N$ of the memory unit 310-W1 (i.e., the plateline $PL_{w1}$ corresponds to a combination of the wordline $WL_W$ and the bitline $BL_1$), with the plateline PL 1B being coupled to the second capacitor electrode of each of the capacitors $CAP_1$ through $CAP_N$ of the memory unit 310-1B (i.e., the plateline PL 1B corresponds to a combination of the wordline $WL_1$ and the bitline $BL_B$), and with the plateline PL WB being coupled to the second capacitor electrode of each of the capacitors $CAP_1$ through $CAP_N$ of the memory unit 310-WB (i.e., the plateline $PL_{WB}$ corresponds to a combination of the wordline $WL_W$ and the bitline BL B). More generally, in the IC device 800, a given plateline $PL_{ij}$ is coupled to the second capacitor electrode of each of the capacitors $CAP_1$ through $CAP_N$ of the memory unit 310-*ij* (i.e., the plateline $PL_{ij}$ corresponds to a combination of the wordline $WL_i$ and the bitline $BL_j$). In such an arrangement, the total number of platelines 360 in the IC device 800 is W×B.

While each plateline $PL_{ij}$ of the IC device 800 is coupled to a unique combination of a wordline $WL_i$ and a bitline $BL_j$, not all capacitors 314 may be addressed by a unique combination of a wordline, a bitline, and a plateline. Rather, each N of the capacitors 314 of a memory unit 310-*ij* that is coupled to a wordline $WL_i$ and a bitline $BL_j$ are coupled to a single plateline $PL_{ij}$, making the combination of the wordline $WL_i$, the bitline $BL_j$, and the plateline $PL_{ij}$ the same (i.e., not unique) for each of the N capacitors 314 of this memory unit. Having each N of the capacitors 314 of a memory unit 310-*ij* of the IC device 300 being addressed by the same combination of a wordline $WL_i$, a bitline $BL_j$, and a plateline $PL_{ij}$, e.g., as is the case with the IC device 800, does not allow performing READ and WRITE operations on different memory cells (i.e., on different capacitors 314) of a given memory unit 310 independently of one another, but may be useful and advantageous in certain deployment scenarios, such as those described for the IC device 700.

Figure 9A:
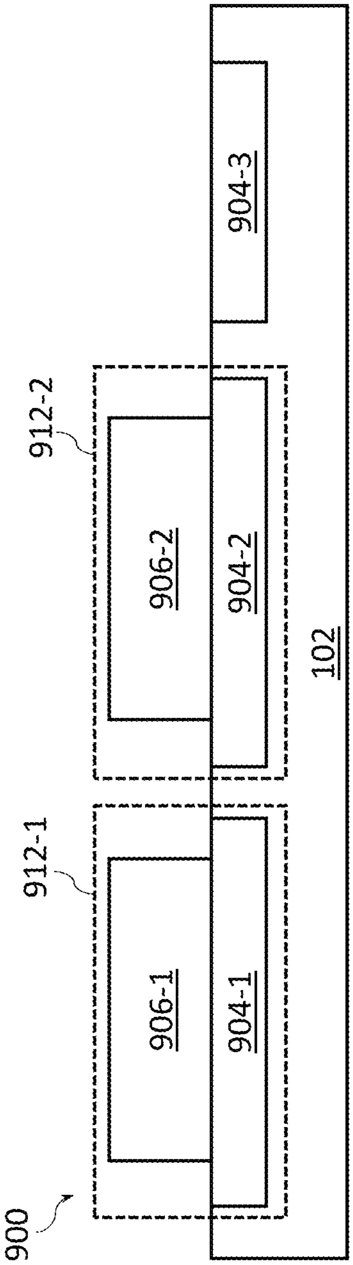
FIG. 9A provides a block diagram of an IC device fabricated using hybrid manufacturing of access transistors for memory and implementing various types of circuits, according to some embodiments of the present disclosure.

FIG. 9A provides a block diagram of an IC device 900 fabricated using hybrid manufacturing of access transistors for memory and implementing various types of circuits, according to some embodiments of the present disclosure. The IC device 900 may be one example of implementing the IC device 100. In particular, FIG. 9A illustrates that the IC device 900 may include circuits 904-1, 904-2, and 904-3 implemented over/in the support structure 102, as described above. Additional circuits 906 may be implemented over at least some of the circuits 904, to achieve the desired functionality. For example, as shown in FIG. 9A, an additional circuit 906-1 may be implemented over the circuit 904-1, and an additional circuit 906-2 may be implemented over the circuit 904-2. These circuits may be designed with different functionality and then combined together on a single support structure 102 in accordance with the spirit of hybrid manufacturing.

For example, the circuit 904-1 may be adapted to be used as part of high-performance memory 912-1, the circuit 904-2 may be adapted to be used as part of high-density memory 912-2, and the circuit 904-3 may be a logic circuit. A circuit designed as a high-performance circuit may not necessarily be a high-density circuit, and vice versa. Similarly, a circuit designed to be a memory circuit may not necessarily have the adequate transistor performance for being a logic circuit. The circuits 904 may be examples of the transistor circuits 104 of the IC device 100. The additional circuits 906 may be examples of layers of additional circuits similar to the capacitor layers 106 of the IC device 100, which may be provided over, and communicatively connected, to the circuits 904 to achieve the desired functionality.

In some embodiments, to realize the high-performance memory 912-1, the circuit 904-1 may include access transistors of high-performance memory and the additional circuit 906-1 may include storage elements of high-performance memory, where IC components (e.g., the storage elements) of the additional circuit 906-1 are coupled to IC components (e.g., the access transistors) of the circuit 904-1. In one example of such embodiments, the circuit 904-1 may include access transistors of 1T-1C memory and the additional circuit 906-1 may include capacitors as storage elements, thus providing 1T-1C memory units as described with reference to FIG. 2. In another example of such embodiments, the circuit 904-1 may include access transistors of SRAM memory and the additional circuit 906-1 may include additional transistors as storage elements.

In some embodiments, to realize the high-density memory 912-2, the circuit 904-2 may include access transistors of high-density memory and the additional circuit 906-2 may include storage elements of high-density memory, where IC components (e.g., the storage elements) of the additional circuit 906-2 are coupled to IC components (e.g., the access transistors) of the circuit 904-2. In one example of such embodiments, the circuit 904-2 may include access transistors and the additional circuit 906-2 may include capacitors as storage elements arranged according to any of the embodiments of an IC device implementing memory with one access transistor for multiple hysteretic capacitors as described with reference to FIGS. 3-8.

The circuit 904-3 may implement, e.g., any of the known arrangements for providing peripheral logic for the memory circuits 904-1 and 904-2, e.g., be a CMOS input/output (I/O) logic circuit.

Figure 9B:
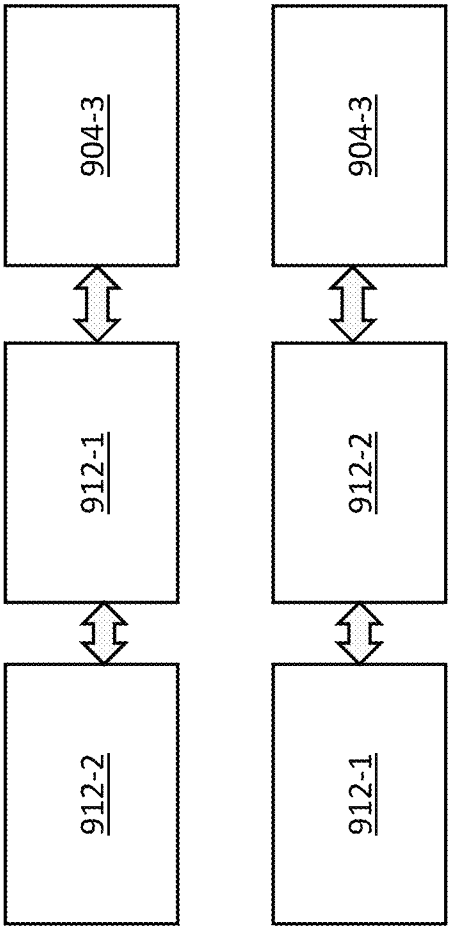
FIG. 9B provides block diagrams of communication routes in the IC device of FIG. 9A, according to some embodiments of the present disclosure.

FIG. 9B provides block diagrams of communication routes in the IC device 900 of FIG. 9A, according to some embodiments of the present disclosure. As shown in the top diagram of FIG. 9B, in some embodiments, the high-density memory 912-2 may be communicatively coupled with the high-performance memory 912-1, and the high-performance memory 912-1 may be communicatively coupled with circuit 904-3. As shown in the bottom diagram of FIG. 9B, in some embodiments, the high-performance memory 912-1 may be communicatively coupled with the high-density memory 912-2, and the high-density memory 912-2 may be communicatively coupled with circuit 904-3.

Figure 10:
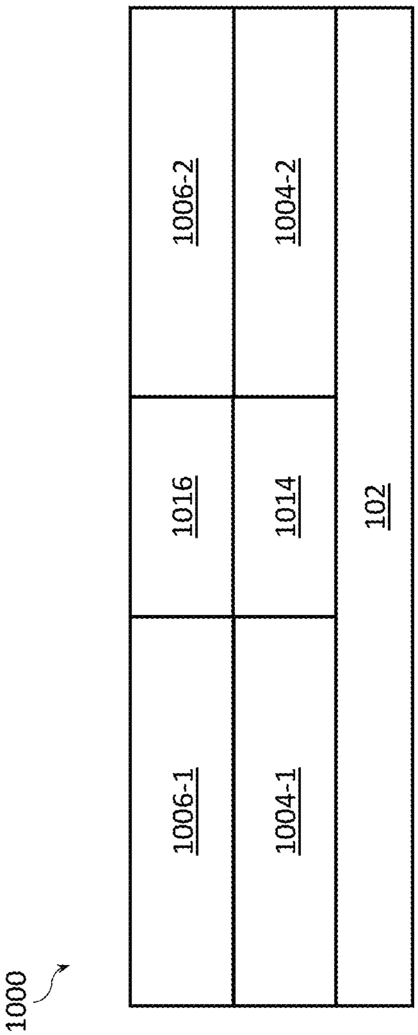
FIG. 10 provides a block diagram of an IC device fabricated using hybrid manufacturing of access transistors for memory and implementing interconnects over scribe lines, according to some embodiments of the present disclosure.

FIG. 10 provides a block diagram of an IC device 1000 fabricated using hybrid manufacturing of access transistors for memory and implementing interconnects over scribe lines, according to some embodiments of the present disclosure. The IC device 1000 may be an example of implementing the IC device 100. In particular, FIG. 10 illustrates that the IC device 1000 may include first and second circuits 1004-1 and 1004-2, implemented over/in the support structure 102, as described above. Backend layers 1006, which may include additional circuit components (e.g., capacitors or other storage elements, interconnects, etc.) may be implemented over at least some of the circuits 1004, to achieve the desired functionality. For example, as shown in FIG. 10, a backend layer 1006-1 may be implemented over the first circuit 1004-1, and a backend layer 1006-2 may be implemented over the second circuit 1004-2. The circuits 1004 and layers 1006 may be designed with different functionality and then combined together on a single support structure 102 in accordance with the spirit of hybrid manufacturing. The circuits 1004 may be examples of the transistor circuits 104 of the IC device 100. The backend layers 1006 may be examples of layers of additional circuits similar to the capacitor layers 106 of the IC device 100, which may be provided over, and communicatively connected, to the circuits 1004 to achieve the desired functionality.

As shown in FIG. 10, in some embodiments, the IC device 1000 may include a scribe line 1014 between the circuits 1004-1 and 1004-2. As known in the art, a scribe line (also sometimes referred to as a kerf, a saw-kerf, or a street) is a space on a wafer that does not contain any active devices and that is typically used to allow separation of the die by cutting or breaking, without damage to the die. FIG. 10 illustrates that a space above the scribe line 1014 may be used to provide interconnects 1016 (e.g., conductive traces and vias) to electrically connect IC components provided on different sides of the scribe line 1014. For example, the interconnects 1016 may be used to electrically connect transistors of the first circuit 1004-1 with transistors of the second circuit 1004-2 and/or with IC components (e.g., capacitors or additional transistors) of the backend layer 1006-2. In another example, the interconnects 1016 may be used to electrically connect transistors of the second circuit 1004-2 with IC components (e.g., capacitors or additional transistors) of the backend layer 1006-1. Some of the interconnects 1016, e.g., conductive traces, may extend continuously over the scribe line 1014.

Figure 11:
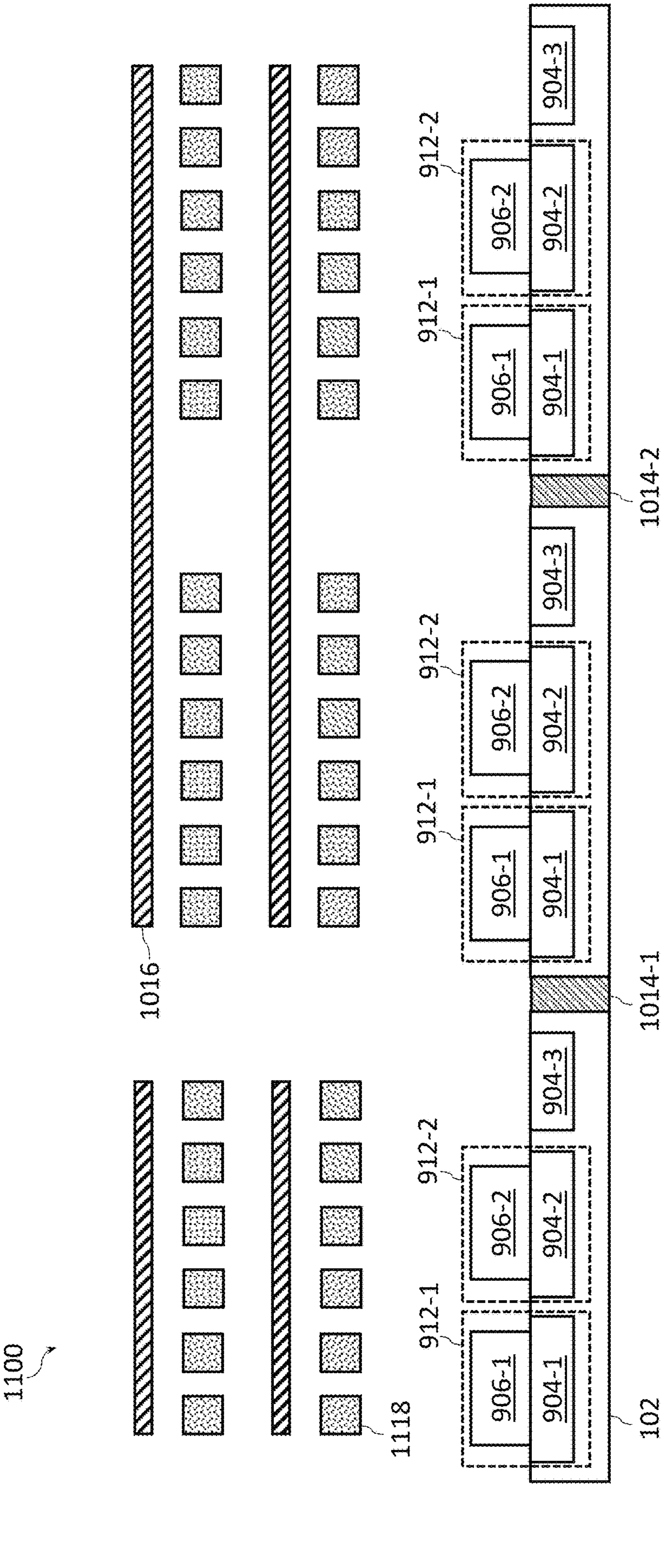
FIG. 11 provides a block diagram of an IC device fabricated using hybrid manufacturing of access transistors for memory and implementing interconnects over scribe lines to connect backend components, according to some embodiments of the present disclosure.

FIG. 11 provides a block diagram of an IC device 1100 fabricated using hybrid manufacturing of access transistors for memory and implementing interconnects over scribe lines to connect backend components, according to some embodiments of the present disclosure. The IC device 1100 is a combination of the embodiments shown in FIG. 9 and in FIG. 10, as can be seen with the reference numerals used in FIG. 11. In particular, the IC device 1100 illustrates how scribe lines 1014-1 and 1014-2 (i.e., two instances of the scribe line 1014 of FIG. 10) may be used between the sets of circuits 904 and 906 as shown in FIG. 9, and how one or more interconnects 1016 of FIG. 10 may continuously extend between at least some of the scribe lines 1014 (over the scribe line 1014-2 for the example shown in FIG. 11). FIG. 11 further schematically illustrates IC components 1118 provided in the backend of the IC device 1100 (e.g., capacitors or other storage elements).

Because the IC devices 900, 1000, and 1100 are examples of the IC device 100, any of the IC devices 900, 1000, and 1100 may further include any of the bonding interfaces 108 and/or the after-bonding vias 110 as described with reference to FIG. 1, although the bonding interfaces 108 and the after-bonding vias 110 are not specifically shown in FIGS. 9-11.

Various arrangements of the IC device 100 as illustrated in FIGS. 1-11 do not represent an exhaustive set of IC devices that may be fabricated using hybrid manufacturing of access transistors for memory as described herein, but merely provide examples of such devices, structures, or assemblies. In particular, the number and positions of various elements shown in FIGS. 1-11 is purely illustrative and, in various other embodiments, other numbers of these elements, provided in other locations relative to one another may be used in accordance with the general architecture considerations described herein.

Arrangements with one or more IC devices fabricated using hybrid manufacturing of access transistors for memory as disclosed herein may be included in any suitable electronic device. FIGS. 12-15 illustrate various examples of devices and components that may include one or more IC devices fabricated using hybrid manufacturing of access transistors for memory as disclosed herein.

Figure 12:
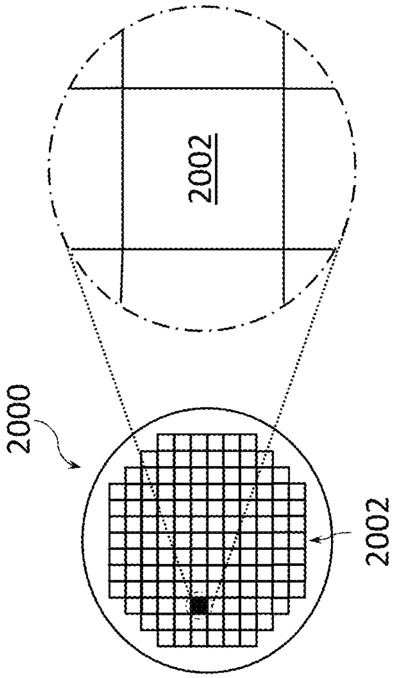
FIG. 12 provides top views of a wafer and dies that may include one or more IC devices fabricated using hybrid manufacturing of access transistors for memory in accordance with any of the embodiments disclosed herein.

FIG. 12 illustrates top views of a wafer 2000 and dies 2002 that may include one or more IC devices fabricated using hybrid manufacturing of access transistors for memory in accordance with any of the embodiments disclosed herein. In some embodiments, the dies 2002 may be included in an IC package, in accordance with any of the embodiments disclosed herein. For example, any of the dies 2002 may serve as any of the dies 2256 in an IC package 2200 shown in FIG. 13. The wafer 2000 may be composed of semiconductor material and may include one or more dies 2002 having IC structures formed on a surface of the wafer 2000. Each of the dies 2002 may be a repeating unit of a semiconductor product that includes any suitable IC (e.g., ICs including one or more IC devices fabricated using hybrid manufacturing of access transistors for memory as described herein). After the fabrication of the semiconductor product is complete (e.g., after manufacture of any embodiment of the IC device 100 as described herein), the wafer 2000 may undergo a singulation process in which each of the dies 2002 is separated from one another to provide discrete “chips” of the semiconductor product. In particular, devices that include one or more IC devices fabricated using hybrid manufacturing of access transistors for memory as disclosed herein may take the form of the wafer 2000 (e.g., not singulated) or the form of the die 2002 (e.g., singulated). The die 2002 may include supporting circuitry to route electrical signals to various memory cells, transistors, capacitors, as well as any other IC components. In some embodiments, the wafer 2000 or the die 2002 may implement or include a memory device (e.g., any of the hysteretic or non-hysteretic memory devices as described herein), a logic device (e.g., an AND, OR, NAND, or NOR gate), or any other suitable circuit element. Multiple ones of these devices may be combined on a single die 2002. For example, a memory array formed by multiple memory devices may be formed on a same die 2002 as a processing device (e.g., the processing device 2402 of FIG. 15) or other logic that is configured to store information in the memory devices or execute instructions stored in the memory array.

Figure 13:
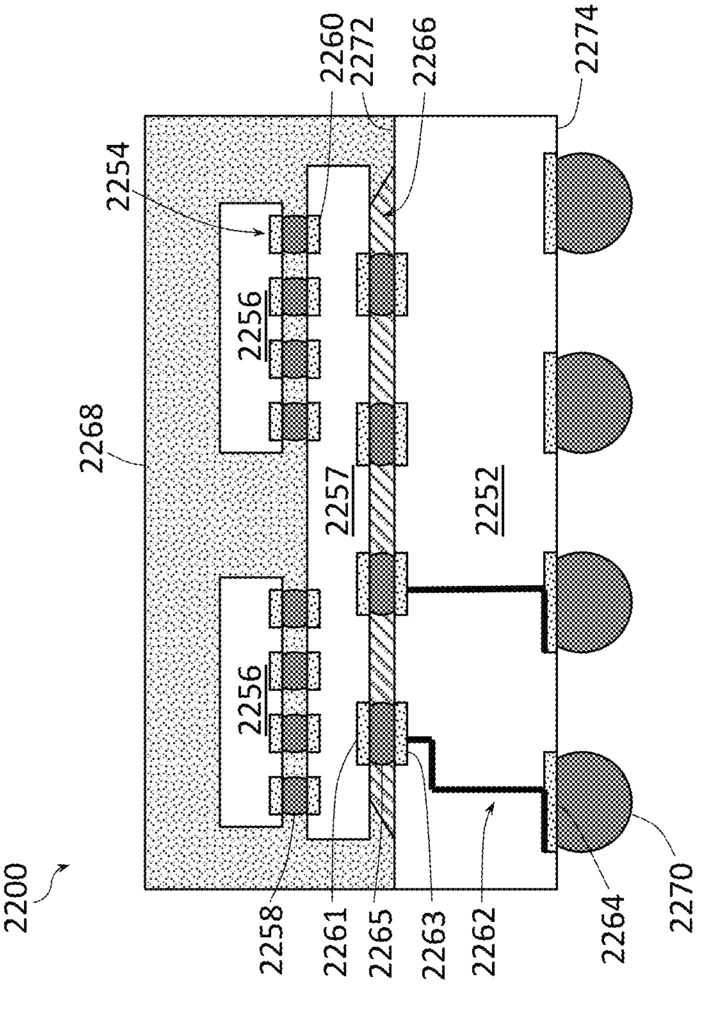
FIG. 13 is a cross-sectional side view of an IC package that may include one or more IC devices fabricated using hybrid manufacturing of access transistors for memory in accordance with any of the embodiments disclosed herein.

FIG. 13 is a side, cross-sectional view of an example IC package 2200 that may include one or more IC devices fabricated using hybrid manufacturing of access transistors for memory in accordance with any of the embodiments disclosed herein. In some embodiments, the IC package 2200 may be a system-in-package (SiP).

The package substrate 2252 may be formed of a dielectric material (e.g., a ceramic, a buildup film, an epoxy film having filler particles therein, etc.), and may have conductive pathways extending through the dielectric material between the face 2272 and the face 2274, or between different locations on the face 2272, and/or between different locations on the face 2274.

The package substrate 2252 may include conductive contacts 2263 that are coupled to conductive pathways 2262 through the package substrate 2252, allowing circuitry within the dies 2256 and/or the interposer 2257 to electrically couple to various ones of the conductive contacts 2264 (or to other devices included in the package substrate 2252, not shown).

The IC package 2200 may include an interposer 2257 coupled to the package substrate 2252 via conductive contacts 2261 of the interposer 2257, first-level interconnects 2265, and the conductive contacts 2263 of the package substrate 2252. The first-level interconnects 2265 illustrated in FIG. 13 are solder bumps, but any suitable first-level interconnects 2265 may be used. In some embodiments, no interposer 2257 may be included in the IC package 2200; instead, the dies 2256 may be coupled directly to the conductive contacts 2263 at the face 2272 by first-level interconnects 2265.

The IC package 2200 may include one or more dies 2256 coupled to the interposer 2257 via conductive contacts 2254 of the dies 2256, first-level interconnects 2258, and conductive contacts 2260 of the interposer 2257. The conductive contacts 2260 may be coupled to conductive pathways (not shown) through the interposer 2257, allowing circuitry within the dies 2256 to electrically couple to various ones of the conductive contacts 2261 (or to other devices included in the interposer 2257, not shown). The first-level interconnects 2258 illustrated in FIG. 13 are solder bumps, but any suitable first-level interconnects 2258 may be used. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, an underfill material 2266 may be disposed between the package substrate 2252 and the interposer 2257 around the first-level interconnects 2265, and a mold compound 2268 may be disposed around the dies 2256 and the interposer 2257 and in contact with the package substrate 2252. In some embodiments, the underfill material 2266 may be the same as the mold compound 2268. Example materials that may be used for the underfill material 2266 and the mold compound 2268 are epoxy mold materials, as suitable. Second-level interconnects 2270 may be coupled to the conductive contacts 2264. The second-level interconnects 2270 illustrated in FIG. 13 are solder balls (e.g., for a ball grid array arrangement), but any suitable second-level interconnects 22770 may be used (e.g., pins in a pin grid array arrangement or lands in a land grid array arrangement). The second-level interconnects 2270 may be used to couple the IC package 2200 to another component, such as a circuit board (e.g., a motherboard), an interposer, or another IC package, as known in the art and as discussed below with reference to FIG. 14.

The dies 2256 may take the form of any of the embodiments of the die 2002 discussed herein (e.g., may include any of the embodiments of the IC devices fabricated using hybrid manufacturing of access transistors for memory as described herein). In embodiments in which the IC package 2200 includes multiple dies 2256, the IC package 2200 may be referred to as a multi-chip package (MCP). The dies 2256 may include circuitry to perform any desired functionality. For example, one or more of the dies 2256 may be logic dies (e.g., silicon-based dies), and one or more of the dies 2256 may be memory dies (e.g., high bandwidth memory), including embedded memory dies as described herein. In some embodiments, any of the dies 2256 may include one or more IC devices fabricated using hybrid manufacturing of access transistors for memory, e.g., as discussed above; in some embodiments, at least some of the dies 2256 may not include any IC devices fabricated using hybrid manufacturing of access transistors for memory.

The IC package 2200 illustrated in FIG. 13 may be a flip chip package, although other package architectures may be used. For example, the IC package 2200 may be a ball grid array (BGA) package, such as an embedded wafer-level ball grid array (eWLB) package. In another example, the IC package 2200 may be a wafer-level chip scale package (WLCSP) or a panel fan-out (FO) package. Although two dies 2256 are illustrated in the IC package 2200 of FIG. 13, an IC package 2200 may include any desired number of the dies 2256. An IC package 2200 may include additional passive components, such as surface-mount resistors, capacitors, and inductors disposed on the first face 2272 or the second face 2274 of the package substrate 2252, or on either face of the interposer 2257. More generally, an IC package 2200 may include any other active or passive components known in the art.

Figure 14:
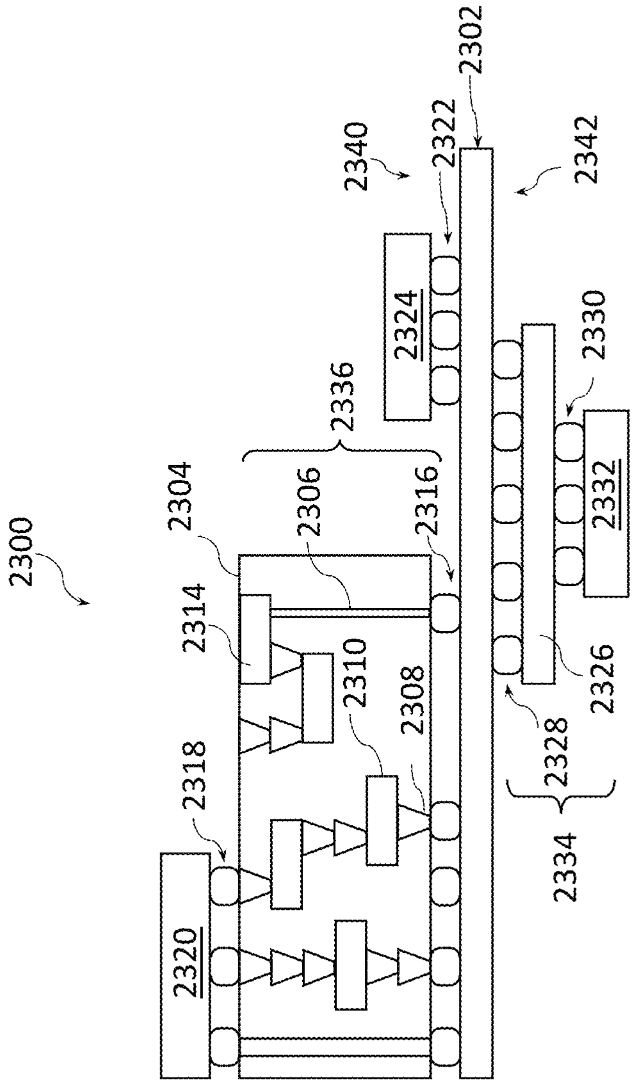
FIG. 14 is a cross-sectional side view of an IC device assembly that may include one or more IC devices fabricated using hybrid manufacturing of access transistors for memory in accordance with any of the embodiments disclosed herein.

FIG. 14 is a cross-sectional side view of an IC device assembly 2300 that may include components having one or more IC devices fabricated using hybrid manufacturing of access transistors for memory in accordance with any of the embodiments disclosed herein. The IC device assembly 2300 includes a number of components disposed on a circuit board 2302 (which may be, e.g., a motherboard). The IC device assembly 2300 includes components disposed on a first face 2340 of the circuit board 2302 and an opposing second face 2342 of the circuit board 2302; generally, components may be disposed on one or both faces 2340 and 2342. In particular, any suitable ones of the components of the IC device assembly 2300 may include any of one or more IC devices fabricated using hybrid manufacturing of access transistors for memory in accordance with any of the embodiments disclosed herein; e.g., any of the IC packages discussed below with reference to the IC device assembly 2300 may take the form of any of the embodiments of the IC package 2200 discussed above with reference to FIG. 13 (e.g., may include one or more IC devices fabricated using hybrid manufacturing of access transistors for memory provided on a die 2256).

In some embodiments, the circuit board 2302 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 2302. In other embodiments, the circuit board 2302 may be a non-PCB substrate.

The IC device assembly 2300 illustrated in FIG. 14 includes a package-on-interposer structure 2336 coupled to the first face 2340 of the circuit board 2302 by coupling components 2316. The coupling components 2316 may electrically and mechanically couple the package-on-interposer structure 2336 to the circuit board 2302, and may include solder balls (e.g., as shown in FIG. 14), male and female portions of a socket, an adhesive, an underfill material, and/or any other suitable electrical and/or mechanical coupling structure.

The package-on-interposer structure 2336 may include an IC package 2320 coupled to an interposer 2304 by coupling components 2318. The coupling components 2318 may take any suitable form for the application, such as the forms discussed above with reference to the coupling components 2316. The IC package 2320 may be or include, for example, a die (the die 2002 of FIG. 12), an IC device, or any other suitable component. In particular, the IC package 2320 may include one or more IC devices fabricated using hybrid manufacturing of access transistors for memory as described herein. Although a single IC package 2320 is shown in FIG. 14, multiple IC packages may be coupled to the interposer 2304; indeed, additional interposers may be coupled to the interposer 2304. The interposer 2304 may provide an intervening substrate used to bridge the circuit board 2302 and the IC package 2320. Generally, the interposer 2304 may spread a connection to a wider pitch or reroute a connection to a different connection. For example, the interposer 2304 may couple the IC package 2320 (e.g., a die) to a BGA of the coupling components 2316 for coupling to the circuit board 2302. In the embodiment illustrated in FIG. 14, the IC package 2320 and the circuit board 2302 are attached to opposing sides of the interposer 2304; in other embodiments, the IC package 2320 and the circuit board 2302 may be attached to a same side of the interposer 2304. In some embodiments, three or more components may be interconnected by way of the interposer 2304.

The interposer 2304 may be formed of an epoxy resin, a fiberglass-reinforced epoxy resin, a ceramic material, or a polymer material such as polyimide. In some implementations, the interposer 2304 may be formed of alternate rigid or flexible materials that may include the same materials described above for use in a semiconductor substrate, such as silicon, germanium, and other group III-V and group IV materials. The interposer 2304 may include metal interconnects 2308 and vias 2310, including but not limited to through-silicon vias (TSVs) 2306. The interposer 2304 may further include embedded devices 2314, including both passive and active devices. Such devices may include, but are not limited to, capacitors, decoupling capacitors, resistors, inductors, fuses, diodes, transformers, sensors, electrostatic discharge (ESD) protection devices, and memory devices. More complex devices such as radio frequency (RF) devices, power amplifiers, power management devices, antennas, arrays, sensors, and microelectromechanical systems (MEMS) devices may also be formed on the interposer 2304. The package-on-interposer structure 2336 may take the form of any of the package-on-interposer structures known in the art.

The IC device assembly 2300 may include an IC package 2324 coupled to the first face 2340 of the circuit board 2302 by coupling components 2322. The coupling components 2322 may take the form of any of the embodiments discussed above with reference to the coupling components 2316, and the IC package 2324 may take the form of any of the embodiments discussed above with reference to the IC package 2320.

The IC device assembly 2300 illustrated in FIG. 14 includes a package-on-package structure 2334 coupled to the second face 2342 of the circuit board 2302 by coupling components 2328. The package-on-package structure 2334 may include an IC package 2326 and an IC package 2332 coupled together by coupling components 2330 such that the IC package 2326 is disposed between the circuit board 2302 and the IC package 2332. The coupling components 2328 and 2330 may take the form of any of the embodiments of the coupling components 2316 discussed above, and the IC packages 2326 and 2332 may take the form of any of the embodiments of the IC package 2320 discussed above. The package-on-package structure 2334 may be configured in accordance with any of the package-on-package structures known in the art.

Figure 15:
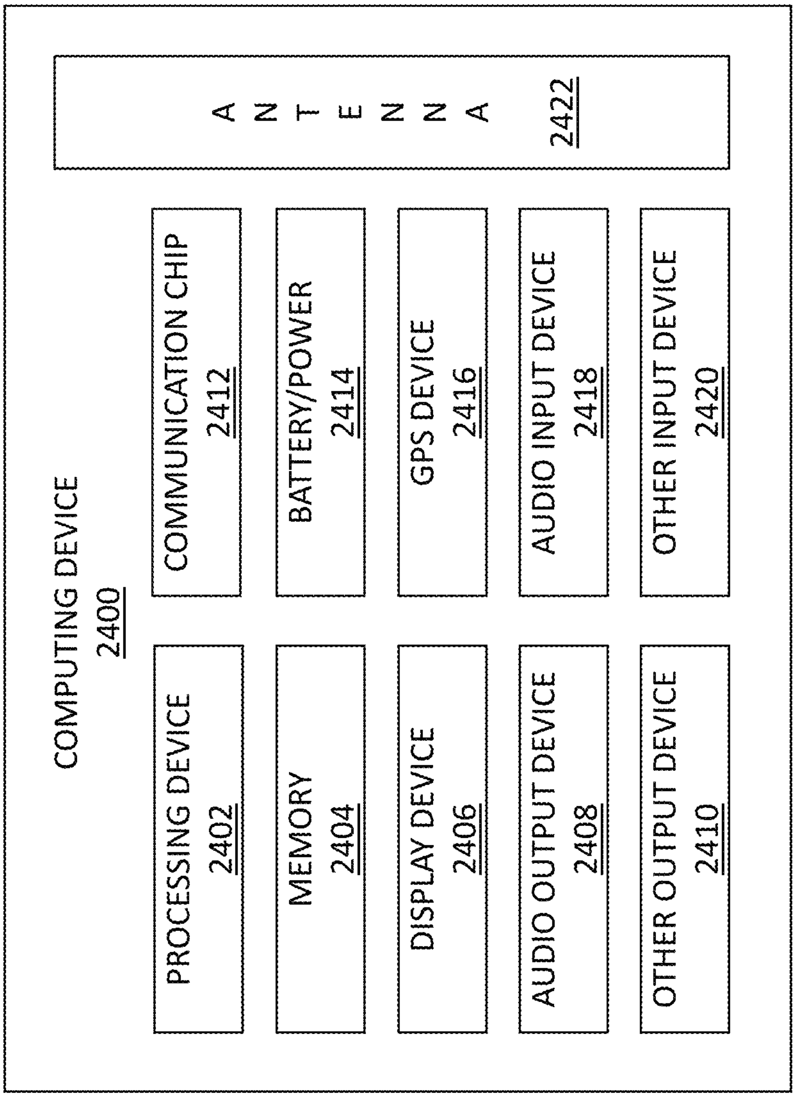
FIG. 15 is a block diagram of an example computing device that may include one or more IC devices fabricated using hybrid manufacturing of access transistors for memory in accordance with any of the embodiments disclosed herein.

FIG. 15 is a block diagram of an example computing device 2400 that may include one or more components with one or more IC devices fabricated using hybrid manufacturing of access transistors for memory in accordance with any of the embodiments disclosed herein. For example, any suitable ones of the components of the computing device 2400 may include a die (e.g., the die 2002 (FIG. 12)) including one or more IC devices fabricated using hybrid manufacturing of access transistors for memory in accordance with any of the embodiments disclosed herein. Any of the components of the computing device 2400 may include an IC package 2200 (FIG. 13). Any of the components of the computing device 2400 may include an IC device assembly 2300 (FIG. 14).

A number of components are illustrated in FIG. 15 as included in the computing device 2400, but any one or more of these components may be omitted or duplicated, as suitable for the application. In some embodiments, some or all of the components included in the computing device 2400 may be attached to one or more motherboards. In some embodiments, some or all of these components are fabricated onto a single SoC die.

Additionally, in various embodiments, the computing device 2400 may not include one or more of the components illustrated in FIG. 15, but the computing device 2400 may include interface circuitry for coupling to the one or more components. For example, the computing device 2400 may not include a display device 2406, but may include display device interface circuitry (e.g., a connector and driver circuitry) to which a display device 2406 may be coupled. In another set of examples, the computing device 2400 may not include an audio input device 2418 or an audio output device 2408 but may include audio input or output device interface circuitry (e.g., connectors and supporting circuitry) to which an audio input device 2418 or audio output device 2408 may be coupled.

The computing device 2400 may include a processing device 2402 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2402 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices. The computing device 2400 may include a memory 2404, which may itself include one or more memory devices such as volatile memory (e.g., DRAM), nonvolatile memory (e.g., read-only memory (ROM)), flash memory, solid state memory, and/or a hard drive. In some embodiments, the memory 2404 may include memory that shares a die with the processing device 2402. This memory may be used as cache memory and may include embedded hysteretic memory, e.g., one or more IC devices fabricated using hybrid manufacturing of access transistors for memory as described herein.

In some embodiments, the computing device 2400 may include a communication chip 2412 (e.g., one or more communication chips). For example, the communication chip 2412 may be configured for managing wireless communications for the transfer of data to and from the computing device 2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2412 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2412 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2412 may operate in accordance with other wireless protocols in other embodiments. The computing device 2400 may include an antenna 2422 to facilitate wireless communications and/or to receive other wireless communications (such as AM or FM radio transmissions).

In some embodiments, the communication chip 2412 may manage wired communications, such as electrical, optical, or any other suitable communication protocols (e.g., the Ethernet). As noted above, the communication chip 2412 may include multiple communication chips. For instance, a first communication chip 2412 may be dedicated to shorter-range wireless communications such as Wi-Fi or Bluetooth, and a second communication chip 2412 may be dedicated to longer-range wireless communications such as global positioning system (GPS), EDGE, GPRS, CDMA, WiMAX, LTE, EV-DO, or others. In some embodiments, a first communication chip 2412 may be dedicated to wireless communications, and a second communication chip 2412 may be dedicated to wired communications.

The computing device 2400 may include battery/power circuitry 2414. The battery/power circuitry 2414 may include one or more energy storage devices (e.g., batteries or capacitors) and/or circuitry for coupling components of the computing device 2400 to an energy source separate from the computing device 2400 (e.g., AC line power).

The computing device 2400 may include a display device 2406 (or corresponding interface circuitry, as discussed above). The display device 2406 may include any visual indicators, such as a heads-up display, a computer monitor, a projector, a touchscreen display, a liquid crystal display (LCD), a light-emitting diode display, or a flat panel display, for example.

The computing device 2400 may include an audio output device 2408 (or corresponding interface circuitry, as discussed above). The audio output device 2408 may include any device that generates an audible indicator, such as speakers, headsets, or earbuds, for example.

The computing device 2400 may include an audio input device 2418 (or corresponding interface circuitry, as discussed above). The audio input device 2418 may include any device that generates a signal representative of a sound, such as microphones, microphone arrays, or digital instruments (e.g., instruments having a musical instrument digital interface (MIDI) output).

The computing device 2400 may include a GPS device 2416 (or corresponding interface circuitry, as discussed above). The GPS device 2416 may be in communication with a satellite-based system and may receive a location of the computing device 2400, as known in the art.

The computing device 2400 may include an other output device 2410 (or corresponding interface circuitry, as discussed above). Examples of the other output device 2410 may include an audio codec, a video codec, a printer, a wired or wireless transmitter for providing information to other devices, or an additional storage device.

The computing device 2400 may include an other input device 2420 (or corresponding interface circuitry, as discussed above). Examples of the other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 2400 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 2400 may be any other electronic device that processes data.

SELECT EXAMPLES

The following paragraphs provide various examples of the embodiments disclosed herein.

Example 1 provides an IC device that includes a support (e.g., a wafer, a substrate, a chip, or a die); a first circuit over a first portion of the support; a second circuit over a second portion of the support; a scribe line between the first circuit and the second circuit; and one or more electrical traces extending over the scribe line.

Example 2 provides the IC device according to example 1, where the scribe line is between at least a portion of the one or more electrical traces and the support.

Example 3 provides the IC device according to examples 1 or 2, where the one or more electrical traces couple one or more components of the first circuit with one or more components of the second circuit.

Example 4 provides the IC device according to any one of the preceding examples, where the first circuit includes transistors of a first transistor architecture and the second circuit includes transistors of a second transistor architecture.

Example 5 provides the IC device according to example 4, where the first transistor architecture and the second transistor architecture are different transistor architectures of a set of a RCAT architecture, a fin-based transistor architecture, a nanoribbon-based transistor architecture, a nanosheet-based transistor architecture, and a nanowire-based transistor architecture.

Example 6 provides the IC device according to examples 4 or 5, further including one or more layers of capacitors over the first circuit, where individual transistors of the first circuit are coupled to individual capacitors of the one or more layers of capacitors forming a plurality of memory units.

Example 7 provides the IC device according to example 6, where the one or more electrical traces couple one or more capacitors of the one or more layers of capacitors with one or more transistors of the second circuit.

Example 8 provides the IC device according to examples 6 or 7, where the second circuit is a peripheral logic circuit for the plurality of memory units.

Example 9 provides the IC device according to any one of examples 6-8, where an individual memory unit of the plurality of memory units includes one transistor of the transistors of the first circuit and one capacitor of the one or more layers of capacitors.

Example 10 provides the IC device according to any one of examples 6-8, where an individual memory unit of the plurality of memory units includes one transistor of the transistors of the first circuit and a plurality of capacitors of the one or more layers of capacitors.

Example 11 provides the IC device according to example 10, further including W wordlines, B bitlines, and P platelines, where a wordline $WL_i$ is one of the W wordlines where i is an integer between 1 and W, a bitline $BL_j$ is one of the B bitlines where j is an integer between 1 and B, the plurality of memory units includes M memory units, a memory unit $MU_{ij}$ is a memory unit of the M memory units that is coupled to the wordline $WL_i$ and the bitline $BL_j$, and includes a transistor $T_{ij}$ and N hysteretic capacitors coupled to the transistor $T_{ij}$, wherein a capacitor $CAP_k$ is one of the N hysteretic capacitors where k is an integer between 1 and N, and a plateline $PL_{jk}$ is a plateline of the P platelines that is coupled to the capacitor $CAP_k$ of the memory unit $MU_{ij}$ that is coupled to the bitline $BL_j$.

Example 12 provides the IC device according to example 11, where N different platelines of the P platelines are coupled to each sub-set of memory units that are coupled to one of the B bitlines.

Example 13 provides the IC device according to examples 11 or 12, where the plateline $PL_{jk}$ is coupled to the capacitor $CAP_k$ of each memory unit of a sub-set of memory units that are coupled to the bitline $BL_j$.

Example 14 provides the IC device according to example 13, where the sub-set of memory units that are coupled to the bitline $BL_j$ includes W memory units.

Example 15 provides the IC device according to examples 13 or 14, where the sub-set of memory units that are coupled to the bitline $BL_j$ is one of B sub-sets of memory units.

Example 16 provides the IC device according to any one of examples 11-15, where P=B×N.

Example 17 provides the IC device according to any one of examples 11-16, where each of the N hysteretic capacitors is coupled to a different (i.e., unique) combination of one of the W wordlines, one of the B bitlines, and one of the P platelines.

Example 18 provides the IC device according to example 10, further comprising W wordlines, B bitlines, and P platelines, where a wordline $WL_i$ is one of the W wordlines where i is an integer between 1 and W, a bitline $BL_j$ is one of the B bitlines where j is an integer between 1 and B, the plurality of memory units includes M memory units, a memory unit $MU_{ij}$ is a memory unit of the M memory units that is coupled to the wordline $WL_i$ and the bitline $BL_j$, and includes an access transistor $T_{ij}$ and N hysteretic capacitors coupled to the access transistor $T_{ij}$, wherein a capacitor $CAP_k$ is any of the N hysteretic capacitors where k is an integer between 1 and N, and a plateline $PL_{jk}$ is a plateline of the P platelines that is coupled to the capacitor $CAP_k$ of the memory unit $MU_{ij}$ that is coupled to the wordline $WL_i$.

Example 19 provides the IC device according to example 18, where N different platelines of the P platelines are coupled to each sub-set of memory units that are coupled to one of the W word lines.

Example 20 provides the IC device according to examples 18 or 19, where the plateline $PL_{ik}$ is coupled to the capacitor $CAP_k$ of each memory unit of a sub-set of memory units that are coupled to the wordline $WL_i$.

Example 21 provides the IC device according to example 20, where the sub-set of memory units that are coupled to the wordline $WL_i$ includes B memory units.

Example 22 provides the IC device according to examples 10 or 11, where the sub-set of memory units that are coupled to the wordline $WL_i$ is one of W sub-sets of memory units.

Example 23 provides the IC device according to any one of examples 18-22, where P=W×N.

Example 24 provides the IC device according to any one of examples 18-23, where each of the N hysteretic capacitors is coupled to a different (i.e., unique) combination of one of the W wordlines, one of the B bitlines, and one of the P platelines.

Example 25 provides the IC device according to example 10, further comprising W wordlines, B bitlines, and P platelines, where a wordline $WL_i$ is any of the W wordlines where i is an integer between 1 and W; B bitlines, a bitline $BL_j$ is any of the B bitlines where j is an integer between 1 and B; M memory units, a memory unit $MU_{ij}$ is a memory unit of the M memory units that is coupled to the wordline $WL_i$ and the bitline $BL_j$, and the memory unit $MU_{ij}$ includes an access transistor $T_{ij}$, and N hysteretic capacitors coupled to the access transistor $T_{ij}$, where a capacitor $CAP_k$ is any of the N hysteretic capacitors where k is an integer between 1 and N. The IC device further includes P platelines, where a plateline $PL_{ij}$ is a plateline of the P platelines that is coupled to each of the N hysteretic capacitors of the memory unit $MU_{ij}$ that is coupled to the wordline $WL_i$ and the bitline $BL_j$.

Example 26 provides the IC device according to example 25, where for each wordline of the W wordlines, B platelines of the P platelines are coupled in a one-to-one correspondence to a sub-set of memory units that are coupled to the wordline.

Example 27 provides the IC device according to examples 25 or 26, where for each bitline of the B bitlines, W platelines of the P platelines are coupled in a one-to-one correspondence to a sub-set of memory units that are coupled to the bitline.

Example 28 provides the IC device according to any one of examples 25-27, where P=W×B.

Example 29 provides the IC device according to any one of examples 11-28, where the access transistor $T_{ij}$ includes a gate terminal, a first one of a source terminal and a drain terminal (first S/D terminal), and a second one of the source terminal and the drain terminal (second S/D terminal), the memory unit $MU_{ij}$ is coupled to the wordline $W_i$ by having the gate terminal of the access transistor $T_{ij}$ of the memory unit $MU_{ij}$ coupled (e.g., directly connected) to the wordline $W_i$, and the memory unit $MU_{ij}$ is coupled to the bitline $B_j$ by having the first S/D terminal of the access transistor $T_{ij}$ of the memory unit $MU_{ij}$ coupled (e.g., directly connected) to the bitline $B_j$.

Example 30 provides the IC device according to example 29, where each hysteretic capacitor of the N hysteretic capacitors includes a first capacitor electrode, a second capacitor electrode, and a hysteretic material or a hysteretic arrangement between the first capacitor electrode and the second capacitor electrode, and each hysteretic capacitor of the N hysteretic capacitors is coupled to the access transistor $T_{ij}$ by having the first capacitor electrode coupled (e.g., directly connected) to the second S/D terminal of the access transistor $T_{ij}$.

Example 31 provides the IC device according to example 30, where the hysteretic material includes a ferroelectric (FE) or an antiferroelectric (AFE) material.

Example 32 provides the IC device according to example 31, where the FE or the AFE material includes a material at least 5% of which is in an orthorhombic phase and/or a tetragonal phase, the material including one or more of a material including hafnium, zirconium, and oxygen, a material including silicon, hafnium, and oxygen, a material including germanium, hafnium, and oxygen, a material including aluminum, hafnium, and oxygen, a material including yttrium, hafnium, and oxygen, a material including lanthanum, hafnium, and oxygen, a material including gadolinium, hafnium, and oxygen, and a material including niobium, hafnium, and oxygen.

Example 33 provides the IC device according to example 30, where the hysteretic arrangement includes a stack of at alternating layers of a material that includes silicon and oxygen and a material that includes silicon and nitrogen.

Example 34 provides the IC device according to example 30, where the hysteretic arrangement includes a stack of a first layer, a second layer, and a third layer, the first layer includes a first insulator material, the second layer includes an electrically conductive material or a semiconductor, and the third layer includes a second insulator material.

Example 35 provides the IC device according to example 34, where a least one of the first insulator material and the second insulator material is a material that includes silicon and oxygen (e.g., silicon oxide), and the second layer includes a material that includes silicon and nitrogen (e.g., silicon nitride).

Example 36 provides an IC device that includes a support (e.g., a wafer, a substrate, a chip, or a die); a memory array, including a first circuit over a first portion of the support and one or more layers of capacitors over the first circuit, where the first circuit includes transistors of a first transistor architecture, and where an individual memory unit of the memory array includes one of the transistors of the first circuit coupled to one or more capacitors of the one or more layers of capacitors; and a second circuit over a second portion of the support, where the second circuit includes transistors of a second transistor architecture.

Example 37 provides the IC device according to example 36, where the first transistor architecture and the second transistor architecture are different transistor architectures of a set of a RCAT architecture, a fin-based transistor architecture, a nanoribbon-based transistor architecture, a nanosheet-based transistor architecture, and a nanowire-based transistor architecture.

Example 38 provides the IC device according to examples 36 or 37, further including a bonding interface between the first circuit and a closest layer of the one or more layers of capacitors; and a via extending through the bonding interface, where each of the first circuit and the one or more layers of capacitors has a first face and an opposing second face (e.g., one of the first and second faces being the frontside of a corresponding IC structure and the other being the backside of the IC structure), the one or more layers of capacitors is bonded to the first circuit by having the first face of the one or more layers of capacitors being bonded to the first face of the first circuit (which may include f2f, f2b, or b2b bonding), and the via extends from the second face of the one or more layers of capacitors to the first face of the first circuit, through the bonding interface, and into the first circuit.

Example 39 provides the IC device according to example 38, where the bonding interface includes an etch-stop material, the etch-stop material including silicon, nitrogen, and carbon, where an atomic percentage of each of silicon, nitrogen, and carbon within the etch-stop material is at least about 1%, e.g., at least about 5%, e.g., between about 1% and 50%, indicating that these elements are added deliberately, as opposed to being accidental impurities which are typically in concentration below about 0.1%.

Example 40 provides the IC device according to any one of examples 36-39, further including a bonding interface between the support and the first circuit; and a via extending through the bonding interface, where each of the support and the first circuit has a first face and an opposing second face (e.g., one of the first and second faces being the frontside of a corresponding IC structure and the other being the backside of the IC structure), the first circuit is bonded to the support by having the first face of the first circuit being bonded to the first face of the support (which may include f2f, f2b, or b2b bonding), and the via extends from the second face of the first circuit to the first face of the support, through the bonding interface, and into the support.

Example 41 provides the IC device according to example 40, where the bonding interface includes an etch-stop material, the etch-stop material including silicon, nitrogen, and carbon, where an atomic percentage of each of silicon, nitrogen, and carbon within the etch-stop material is at least about 1%, e.g., at least about 5%, e.g., between about 1% and 50%, indicating that these elements are added deliberately, as opposed to being accidental impurities which are typically in concentration below about 0.1%.

Example 42 provides the IC device according to any one of examples 36-41, further including a bonding interface between the support and the second circuit; and a via extending through the bonding interface, where each of the support and the second circuit has a first face and an opposing second face (e.g., one of the first and second faces being the frontside of a corresponding IC structure and the other being the backside of the IC structure), the second circuit is bonded to the support by having the first face of the second circuit being bonded to the first face of the support (which may include f2f, f2b, or b2b bonding), and the via extends from the second face of the second circuit to the first face of the support, through the bonding interface, and into the support.

Example 43 provides an IC device that includes a support (e.g., a wafer, a substrate, a chip, or a die); a first memory array over a first portion of the support; and a second memory array over a second portion of the support, where the first memory array includes memory units of a first memory architecture, and the second memory array includes memory units of a second memory architecture.

Example 44 provides the IC device according to example 43, where the first memory architecture and the second memory architecture are different memory architectures of a set of a hysteretic memory, a non-hysteretic memory, a one transistor one capacitor memory, and a one transistor multiple capacitors memory.

Example 45 provides the IC device according to any one of examples 43-44, where at least access transistors of the first memory array are monolithically integrated with the support, and where the IC device further includes a bonding interface between the support and the second memory array; and a via extending through the bonding interface, where each of the support and the second memory array has a first face and an opposing second face (e.g., one of the first and second faces being the frontside of a corresponding IC structure and the other being the backside of the IC structure), the second memory array is bonded to the support by having the first face of the second memory array being bonded to the first face of the support (which may include f2 f, f2b, or b2b bonding), and the via extends from the second face of the second memory array to the first face of the support, through the bonding interface, and into the support.

Example 46 provides an IC package that includes an IC device according to any one of the preceding examples; and a further IC component, coupled to the IC device.

Example 47 provides the IC package according to example 46, where the further component includes one of a package substrate and an interposer.

Example 48 provides the IC package according to example 46, where the further component is a further IC die.

Example 49 provides the IC package according to any one of examples 46-48, where the IC device includes, or is a part of, at least one of a memory device, a computing device, a wearable device, a handheld electronic device, and a wireless communications device.

Example 50 provides an electronic device that includes a carrier substrate; and one or more of the IC device according to any one of the preceding examples and the IC package according to any one of the preceding examples, coupled to the carrier substrate.

Example 51 provides the electronic device according to example 50, where the carrier substrate is a motherboard.

Example 52 provides the electronic device according to example 50, where the carrier substrate is a PCB.

Example 53 provides the electronic device according to any one of examples 50-52, where the electronic device is a wearable electronic device (e.g., a smart watch) or handheld electronic device (e.g., a mobile phone).

Example 54 provides the electronic device according to any one of examples 50-53, where the electronic device further includes one or more communication chips and an antenna.

Example 55 provides the electronic device according to any one of examples 50-54, where the electronic device is an RF transceiver.

Example 56 provides the electronic device according to any one of examples 50-54, where the electronic device is one of a switch, a power amplifier, a low-noise amplifier, a filter, a filter bank, a duplexer, an upconverter, or a downconverter of an RF communications device, e.g., of an RF transceiver.

Example 57 provides the electronic device according to any one of examples 50-54, where the electronic device is a computing device.

Example 58 provides the electronic device according to any one of examples 50-57, where the electronic device is included in a base station of a wireless communication system.

Example 59 provides the electronic device according to any one of examples 50-57, where the electronic device is included in a user equipment device (i.e., a mobile device) of a wireless communication system.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize. These modifications may be made to the disclosure in light of the above detailed description.

The invention claimed is:

1. An integrated circuit (IC) device, comprising:

M memory units;

W wordlines;

B bitlines; and

P platelines;

wherein:

a wordline $WL_i$ is one of the W wordlines where i is an integer between 1 and W, a bitline $BL_j$ is one of the B bitlines where j is an integer between 1 and B, and a memory unit $MU_{ij}$ is a memory unit of the M memory units that is coupled to the wordline $WL_i$ and the bitline $BL_j$, and includes a transistor $T_{ij}$ and N capacitors coupled to the transistor $T_{ij}$, wherein a capacitor $CAP_k$ is one of the N capacitors where k is an integer between 1 and N.

2. The IC device according to claim 1, wherein:

a plateline $PL_{jk}$ is a plateline of the P platelines that is coupled to the capacitor $CAP_k$ of the memory unit $MU_{ij}$ that is coupled to the bitline $BL_j$.

3. The IC device according to claim 2, wherein:

N different platelines of the P platelines are coupled to each sub-set of memory units that are coupled to one of the B bitlines.

4. The IC device according to claim 2, wherein:

the plateline $PL_{jk}$ is coupled to the capacitor CAP of each memory unit of a sub-set of memory units that are coupled to the bitline $BL_j$.

5. The IC device according to claim 4, wherein:

the sub-set of memory units that are coupled to the bitline $BL_j$ includes W memory units.

6. The IC device according to claim 4, wherein:

the sub-set of memory units that are coupled to the bitline $BL_j$ is one of B sub-sets of memory units.

7. The IC device according to claim 2, wherein P=B×N.

8. The IC device according to claim 2, wherein each of the N capacitors is coupled to a different combination of one of the W wordlines, one of the B bitlines, and one of the P platelines.

9. The IC device according to claim 2, wherein:

each capacitor of the N capacitors includes a first capacitor electrode, a second capacitor electrode, and a material between the first capacitor electrode and the second capacitor electrode, each capacitor of the N capacitors is coupled to the transistor $T_{ij}$ by having the first capacitor electrode coupled to a source or drain terminal of the transistor $T_{ij}$, and the material includes a material at least 5% of which is in an orthorhombic phase and/or a tetragonal phase, the material including one or more of:

a material including hafnium, zirconium, and oxygen, a material including silicon, hafnium, and oxygen, a material including germanium, hafnium, and oxygen, a material including aluminum, hafnium, and oxygen, a material including yttrium, hafnium, and oxygen, a material including lanthanum, hafnium, and oxygen, a material including gadolinium, hafnium, and oxygen, and a material including niobium, hafnium, and oxygen.

10. The IC device according to claim 2, wherein:

each capacitor of the N capacitors includes a first capacitor electrode, a second capacitor electrode, and an arrangement between the first capacitor electrode and the second capacitor electrode, each capacitor of the N capacitors is coupled to the transistor $T_{ij}$ by having the first capacitor electrode coupled to a source or drain terminal of the transistor $T_{ij}$, and the arrangement includes a stack of at alternating layers of a material that includes silicon and oxygen and a material that includes silicon and nitrogen.

11. The IC device according to claim 1, wherein:

a plateline $PL_{jk}$ is a plateline of the P platelines that is coupled to the capacitor $CAP_k$ of the memory unit $MU_{ij}$ that is coupled to the wordline $WL_i$, wherein P=W×N.

12. The IC device according to claim 1, wherein:

a plateline $PL_{ij}$ is a plateline of the P platelines that is coupled to each of the N capacitors of the memory unit $MU_{ij}$ that is coupled to the wordline WL; and the bitline $BL_j$, wherein P=W×B.

13. An integrated circuit (IC) device, comprising:

a memory array, comprising a first circuit and one or more layers of capacitors over the first circuit, wherein the first circuit includes transistors of a first transistor architecture, and wherein an individual memory unit of the memory array includes one of the transistors of the first circuit coupled to one or more capacitors of the one or more layers of capacitors;

a second circuit, wherein the second circuit includes transistors of a second transistor architecture; and a bonding layer between the first circuit and a closest layer of the one or more layers of capacitors, wherein the bonding layer includes silicon, nitrogen, and carbon, where an atomic percentage of each of silicon, nitrogen, and carbon within the bonding layer is at least about 1%.

14. The IC device according to claim 13, further comprising:

a via extending through the bonding layer.

15. An integrated circuit (IC) device, comprising:

a substrate;

a first memory array over a first portion of the substrate;

a second memory array over a second portion of the substrate; and a bonding interface between the substrate and the second memory array, wherein the first memory array includes memory units of a first memory architecture, and the second memory array includes memory units of a second memory architecture.

16. The IC device according to claim 15, further comprising:

a via extending through the bonding interface, wherein:

each of the substrate and the second memory array has a first face and an opposing second face, the second memory array is bonded to the substrate by having the first face of the second memory array being bonded to the first face of the substrate, and the via extends from the second face of the second memory array to the first face of the substrate, through the bonding interface, and into the substrate.

17. The IC device according to claim 13, further comprising:

a die, wherein the first circuit is over a first portion of the die and the second circuit is over a second portion of the die.

18. The IC device according to claim 15, wherein one or more transistors of the first memory array are monolithically integrated with the substrate.

19. The IC device according to claim 1, further comprising:

a first circuit comprising transistors of a first transistor architecture; and a second circuit comprising transistors of a second transistor architecture, wherein:

the first transistor architecture and the second transistor architecture are different transistor architectures of a set of a recess channel array transistor (RCAT) architecture, a fin-based transistor architecture, a nanoribbon-based transistor architecture, a nanosheet-based transistor architecture, and a nanowire-based transistor architecture.

20. The IC device according to claim 19, further comprising one or more layers of capacitors over the first circuit, wherein individual transistors of the first circuit are coupled to individual capacitors of the one or more layers of capacitors forming a plurality of memory units, and wherein the plurality of memory units includes the M memory units.

21. The IC device according to claim 20, wherein an individual memory unit of the plurality of memory units includes one transistor of the transistors of the first circuit and a plurality of capacitors of the one or more layers of capacitors.

22. The IC device according to claim 19, further comprising:

a scribe line between the first circuit and the second circuit; and one or more electrical traces extending over the scribe line.

* * * * *